(12) United States Patent  (10) Patent No.: US 7,821,338 B2
Llewellyn  (45) Date of Patent: Oct. 26, 2010

(54) AMPLIFIER CURRENT DRIVE REVERSAL

(75) Inventor: William D. Llewellyn, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/425,790

(22) Filed: Apr. 17, 2009

(65) Prior Publication Data

US 2010/0001799 A1   Jan. 7, 2010

Related U.S. Application Data

(60) Provisional application No. 61/046,266, filed on Apr. 18, 2008.

(51) Int. Cl.
H03F 3/217 (2006.01)
(52) U.S. Cl. .................... 330/251; 330/207 A
(58) Field of Classification Search ............... 330/251, 330/207 A
See application file for complete search history.

(56) References Cited

U.S. PATENT DOCUMENTS

| 4,330,756 | A  | * | 5/1982 | Moreau ................... 330/297 |
| 5,898,342 | A  | * | 4/1999 | Bell ....................... 330/297 |
| 6,724,830 | B2 | * | 4/2004 | Do et al. .................. 375/295 |
| 7,031,457 | B2 | * | 4/2006 | Melsa .................. 379/399.01 |
| 7,167,046 | B2 | * | 1/2007 | Maejima ............... 330/207 A |
| 7,570,118 | B1 | * | 8/2009 | Gaboriau et al. .......... 330/298 |

* cited by examiner

*Primary Examiner*—Patricia Nguyen
(74) *Attorney, Agent, or Firm*—Schwegman, Lundberg & Woessner, P.A.

(57) ABSTRACT

A drive current direction between first and second amplifiers can be selected using a received indication of an output current in an at least partially reactive load, and an amplified output signal can be produced using the selected drive current direction and the first and second amplifiers. Further, the first and second amplifiers can be configured to alternate between a pull-up mode and a pull-down mode, each amplifying half of a full wave output signal.

23 Claims, 29 Drawing Sheets

AMPLIFIER CURRENT DRIVE REVERSAL

CLAIM OF PRIORITY

This patent application claims the benefit of priority, under 35 U.S.C. Section 119(e), to William D. Llewellyn U.S. Provisional Patent Application Ser. No. 61/046,266, entitled "Current Drive Reversal Technique For A Bridged Class-G Amplifier," filed on Apr. 18, 2008, hereby incorporated by reference in its entirety.

This patent application is related to Cary L. Delano U.S. Pat. No. 7,498,880, entitled "Class L Amplifier," hereby incorporated by reference in its entirety.

BACKGROUND

Class-G amplifier configuration can exhibit distinct advantages over conventional class-AB and class-D topologies. Class-G amplification, by employing multiple supply rails of differing voltages in the output stage and selectively commutating among the supplies as the output voltage varies, is able to effectively minimize the voltage drop across the output power devices at any given instant, thereby minimizing power dissipation in the amplifier and reducing overall power consumption. Class-AB, with two fixed rails, is inherently less efficient because no attempt is made to minimize VI losses in the output devices. Class-D employs switched output devices in which the VI product is, on average, very small and thus is generally very efficient, but requires extra support components in the form of low pass filtering at its outputs. Class-D topologies have the additional disadvantages of producing electromagnetic interference (EMI) emissions and exhibiting output voltage overshoots that can be difficult to manage and which can compromise reliability.

A Class-G implementation may employ any of a number of available topologies to minimize the VI product, and therefore power dissipation, in the output stage. FIGS. 1 and 2 illustrate generally examples of a bridge-tied load (BTL) amplifier configuration wherein two class-G amplifiers—effectively two class-AB amplifiers with selectable supply rails—drive identical signals of opposite phase into a load. FIG. 3 illustrates generally an example of a rail selector. FIGS. 4 and 5 illustrate generally associated waveforms for the example amplifier configurations of FIGS. 1 and 2.

Another example of a BTL amplifier configuration includes an ST Microelectronics TDA7563 car audio amplifier chip. In this example, at any given time, only one of the two amplifiers is on, and the other is off. The "on" amplifier drives the full signal at one end of the load, and the "off" amplifier is simply switched to GND. As the output signal changes polarity, the two amplifiers alternate states. This cuts the power dissipation roughly in half versus a conventional Class AB configuration.

In other examples, a common mode voltage of a pair of bridged amplifier outputs can be selectively shifted as needed to lie between any pair of a multiplicity of varyingly spaced power rails, with the particular pair of rails chosen at any given instant possessing the minimum spacing needed to accommodate the amplitude of the output signal being issued at that instant, and with the amplifier's output devices selectively conducting current out of the higher of the two chosen rails of the selected pair, through the load, and into the lower of the two chosen rails of the selected pair.

Overview

In any integrated amplifier implementation, cost is a concern. Cost can be driven by a number of factors, including IC process complexity and die size. The complimentary bipolar transistor configuration shown in FIG. 2 can conduct relatively high currents without requiring unmanageably large amounts of die area due, at least in part, to a high transconductance of the bipolar output devices. However, bipolar IC processes are generally more complex than CMOS processes, making CMOS (or DMOS) a more desirable design solution. Additionally, in the case of either bipolar or CMOS process types, the n-type device (bipolar NPN or CMOS N-channel device) is inherently stronger (e.g., has greater transconductance) per unit area than the p-type device, making it a more attractive choice for both output pull-up and pull-down (current source or sink) purposes for area conservation reasons. Thus, in FIG. 2, the p-type bipolar devices in the output stages require substantially more die area than would be needed if all output devices were n-type, whether bipolar or CMOS.

Further, in certain examples, the available output voltage swing in the BTL amplifier configuration of FIG. 2 can be inherently limited, in certain examples, to one base-emitter potential (Vbe) from the supply rail. This can reduce the maximum available power that can be delivered to the load compared to a configuration that allows the outputs to swing virtually all the way to the supply rails. (Note also that if CMOS were substituted for the bipolar devices, the voltage swing limitation would be worse, in that the output voltage could come no closer to the selected power supply rail than Vt+Vdsat, which is usually even larger than one bipolar Vbe.)

An alternative to this configuration that would allow the outputs to swing closer to the rails can include the use of a complementary push-pull transconductance output stage wherein the output device collectors (or drains) connect to the output terminal. However, this once again requires the p-type device, with the area disadvantages discussed above.

The present inventor has recognized, among other things, that a more desirable BTL amplifier configuration can include one that employs more space-efficient n-type devices in the output section (in certain examples, exclusively n-type devices) and is also capable of pulling the output voltages very close to any selected supply rails.

In an example BTL amplifier configuration presented herein, a pair of BTL configured output amplifiers employ at least two NMOS output devices each to deliver load current, with one of these NMOS devices used as a switch to hold its output fixed to a selected rail from which current can be drawn, and the other NMOS device (or even an NPN) configured to function in transconductance mode to sink a variable load current to another rail in response to the input signal. At substantially any time, one of the amplifiers is in the switched pull-up mode and the other would be in the variable transconductance pull-down mode. The amplifiers can swap their operating modes as needed to amplify each half of a full wave output signal. This all-n-type configuration can provide a determinable (e.g., maximum) available output swing because the minimum voltage drop across the NMOS pull-up switch device is limited only by Rds-on, and the minimum voltage drop across the NMOS pull-down transconductance device is essentially Vdsat (or Vsat for an NPN). This can allow the outputs to swing substantially closer to the selected rails than one Vbe for bipolar devices or Vt+Vdsat for MOS devices. In keeping with the tenets of class-G operation, the amplifiers would also be able to use any of a plurality of class-G supply rails in either the fixed voltage (switched pull-up) mode or the transconductance (variable pull-down) mode, depending on the instantaneous load voltage, to minimize VI losses. Such a configuration is shown in FIGS. 7 and 8.

One potential disadvantage of the example BTL amplifier configuration disclosed herein would be its ability to conduct current in only one direction at a time—from the amplifier in the switched pull-up mode, through the load, and into the amplifier in the transconductance pull-down mode. To see why this unidirectional flow can be a liability, first consider the ideal case for such an architecture—the case where the load is purely resistive, wherein the current is always directly proportional to the voltage forced across it by the amplifier. In the example of FIG. 3, the selection of power supply rails can be accomplished exclusively based on the voltage across the load. If the load is resistive and the load voltage is positive, the current can flow from the VCC[X]-1 supply to the VCC[Y]-0 supply (e.g., left to right). If the load is resistive and the load voltage is negative, the current can flow from the VCC[X]-0 supply to the VCC[Y]-1 supply (e.g., right to left). In each of these two cases, having the pull-up switch connected to a more positive supply than the supply rail to which the pull-down transconductance device is conducting is appropriate, and the use of voltage-based supply selection is then also appropriate.

However, real world audio loudspeaker loads are rarely purely resistive, and generally have assorted reactive components that cause the relationship of the load's current to the voltage placed across it by the amplifier to be more complex than that seen with a simple resistor. For example, a loudspeaker can appear partially inductive at some frequencies (the phase of the load current lagging behind the load voltage), and partially capacitive at other frequencies (the phase of the load current leading the load voltage). FIG. 9 illustrates generally an example of a phase relationship between a current to a voltage in an example load (e.g., an example speaker, across the speaker terminals). Here, the current lags the voltage at some frequencies and leads the voltage at others. Thus, as the voltage being forced across the load experiences a zero-crossing (a reversal), the current can reverse subsequent to (with an inductive load) or prior to (with a capacitive load) the voltage reversal. That is to say, there are periods of time during which the sense of the desired load voltage and the sense of the current necessary to produce or sustain that desired load voltage can oppose one another. Thus, a class-G BTL configuration (or other amplifier BTL amplifier configuration) that uses the load voltage alone to decide its output current driving direction cannot properly manage these opposing sense situations because it can only supply current in the direction that is commensurate with the sense of the load voltage.

In an example, a voltage-only range control scheme can suffer when a load appears inductive and a load voltage is passing through and beyond a zero crossing. For a time, a current continues to flow in the same direction as it did prior to the voltage reversal. As the reversed voltage continues to increase, a typical class-G BTL configuration can eventually reverse its operating mode to handle anticipated current flow opposite that of the actual residual load current. As a result, the load voltage can become uncontrolled (e.g., the loop breaks) and a discontinuity can occur in the output waveform.

In another example, the voltage-only controlled configuration can suffer when the load is purely capacitive and the amplifier needs to reverse the voltage while the voltage is well into the positive region (e.g., when traversing the positive crest of a sine wave). Here, the load current can momentarily fall to zero at the peak of the crest (because capacitor current is the derivative of the voltage, e.g., I=C*dV/dt) and then must be driven in the opposite direction by the amplifier in order to maintain the proper voltage trajectory in the load. However, because the amplifier still senses the voltage as being in the positive domain, the typical configuration continues to maintain the two amplifiers in the mode that supported the direction of current in the initial (pre-crest) direction and can be unable to produce the necessary current reversal in the capacitive load. Once again, the load voltage can become uncontrolled (the loop breaks) and a discontinuity in the output waveform can occur.

In certain examples, a class-G (or other class) amplifier configuration comprising two unidirectional current-drive amplifiers cannot unilaterally base decisions governing its operating mode solely on the output voltage if a reactive load is being driven. Such amplifiers that use voltage criteria alone can be prone to mishandle reactive loads. Accordingly, an approach in which the amplifier control mechanism is appropriately responsive to both load voltage and load current is needed.

In an example, a drive current direction between first and second amplifiers can be selected using a received indication of an output current in an at least partially reactive load, and an amplified output signal can be produced using the selected drive current direction and the first and second amplifiers. Further, the first and second amplifiers can be configured to alternate between a pull-up mode and a pull-down mode, each amplifying half of a full wave output signal.

Example 1 includes a bridge-tied load (BTL) amplifier system for driving an at least partially reactive load including first and second amplifiers configured to receive an input signal and to produce an amplified output signal, each of the first and second amplifiers including an output stage, each of the output stages including a pull-up device configured to draw current from a first power rail and a pull-down device configured to sink current into a second power rail, the first and second amplifiers, configured to alternate between a pull-up mode and a pull-down mode, each amplifying substantially half of a full wave output signal, and digital logic circuitry configured to receive an indication of output current in the load and to select a current drive direction of the first and second amplifiers using the received output current information.

In Example 2, the first and second amplifiers of Example 1 are optionally configured to drive an at least partially reactive load.

In Example 3, the digital logic circuitry of any one or more of Examples 1-2 are optionally configured to receive the indication of output current in the load, the output current at least partially out of phase with an output voltage in the load.

In Example 4, the pull-up and pull-down devices of any one or more of Examples 1-3 optionally include n-type devices.

In Example 5, the pull-up device of any one or more of Examples 1-4 optionally includes a pull-up switch configured to draw current from and hold its output to the first power rail, and the pull-down device of any one or more of Examples 1-4 optionally includes a transconductive pull-down device configured to sink a variable current into the second power rail in response to the received input signal.

In Example 6, the pull-up device of any one or more of Examples 1-5 optionally includes a transconductive pull-up device configured to draw a variable current from the first power rail in response to the received input signal, wherein the pull-down device of any one or more of Examples 1-5 optionally includes a pull-down switch configured to sink current to and hold its output to the second power rail.

In Example 7, the first power rail of any one or more of Examples 1-6 optionally includes one of a plurality of available power rails, the second power rail of any one or more of Examples 1-6 optionally includes one of the plurality of available power rails, and the digital logic circuitry of any one or more of Examples 1-6 is optionally configured to receive an indication of a target output voltage in a load and to select the first and second power rails for each of the first and second amplifiers from the plurality of available power rails using the received output voltage information.

In Example 8, the digital logic circuitry of any one or more of Examples 1-7 is optionally configured to select the first and second power rails for each of the first and second amplifiers using the received target output voltage information to minimize a voltage drop between the selected first and second power rails and the received target output voltage information.

In Example 9, a bridge-tied load (BTL) amplifier system, responsive to both load voltage and load current, for driving an at least partially reactive load, includes first and second amplifiers configured to receive an input signal and to produce an amplified output signal, each of the first and second amplifiers including an output stage, each of the output stages including a pull-up switch configured to draw current from and hold its output to one of a plurality of available power rails and a transconductive pull-down device configured to sink a variable current into one of the plurality of available power rails in response to the input signal, the first and second amplifiers, configured to alternate between a switched pull-up mode and a variable pull-down mode, each amplifying substantially half of a full wave output signal, and digital logic circuitry configured to receive an indication of an output current and a target output voltage in the load, to select a current drive direction of the first and second amplifiers using the received output current information, and to select the power rails for each of the first and second amplifiers from the plurality of available power rails using the received output voltage information.

In Example 10, the first and second amplifiers of Example 9 are optionally configured to drive an at least partially reactive load.

In Example 11, the digital logic circuitry of any one or more of Examples 9-10 is optionally configured to receive the indication of output current and the target output voltage in the load, the output current at least partially out of phase with the target output voltage.

In Example 12, the pull-up and pull-down devices of any one or more of Examples 9-11 optionally include n-type devices.

In Example 13, the digital logic circuitry of any one or more of Examples 9-12 is optionally configured to select the power rails for each of the first and second amplifiers using the received output voltage information to minimize a voltage drop between the selected power rails and the received target output voltage information.

In Example 14, a method of driving an at least partially reactive load includes receiving an input signal at first and second amplifiers, receiving an indication of an output current in the load, selecting a drive current direction between the first and second amplifiers using the received output current information, and producing an amplified output signal using the selected drive current direction and the first and second amplifiers, the first and second amplifiers, configured to alternate between a pull-up mode and a pull-down mode, each amplifying half of a full wave output signal.

In Example 15, the producing the amplified output signal of Example 14 optionally includes producing an amplified output signal to drive an at least partially reactive load.

In Example 16, the receiving the indication of the output current in the load of any one or more of Examples 14-15 optionally includes receiving an indication of an output current at least partially out of phase with an output voltage in the load.

In Example 17, the method of any one or more of Examples 14-16 optionally includes drawing current for each of the first and second amplifiers from a first power rail using pull-up devices and sinking current for each of the first and second amplifiers to a second power rail using pull-down devices.

In Examples 18, the drawing and sinking the current for the first and second amplifiers of any one or more of Examples 14-17 optionally includes drawing current using n-type pull-up devices and sinking current using n-type pull-down devices.

In Example 19, the drawing the current for the first and second amplifiers of any one or more of Examples 14-18 optionally includes using a pull-up switch configured to draw current from and hold its output to the first power rail, and the sinking the current for the first and second amplifiers of any one or more of Examples 14-18 optionally includes using a transconductive pull-down device configured to sink a variable current into the second power rail in response to the received input signal.

In Example 20, the drawing the current for the first and second amplifiers of any one or more of Examples 14-19 optionally includes using a transconductive pull-up device configured to draw a variable current from the first power rail in response to the received input signal, and the sinking the current for the first and second amplifiers of any one or more of Examples 14-19 optionally includes using a pull-down switch configured to sink current into and hold its output to the second power rail.

In Example 21, the method of any one or more of Examples 14-20 optionally includes drawing current for each of the first and second amplifiers from one of a plurality of available power rails using pull-up devices and sinking current for each of the first and second amplifiers from one of the plurality of available power rails using pull-down devices.

In Example 22, the method of any one or more of Examples 14-21 optionally includes receiving an indication of a target output voltage in a load and selecting the power rails for each of the first and second amplifiers from the one of the plurality of available power rails using the received target output voltage information.

In Example 23, the selecting the power rails for each of the first and second amplifiers of any one or more of Examples 14-22 optionally includes to minimize a voltage drop between the selected first and second power rails and the received target output voltage information.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized, among other things, that a magnitude and direction of a current in a load of a bridge-tied load (BTL) class-G amplifier configuration can be sensed (e.g., at any instant), and that this information can be incorporated into the selection of a current drive direction of the amplifier, rather than making said decisions based on the output voltage. In certain examples, the target output voltage can still be used to determine which set of the power devices is appropriate for conduction between the supply rails and the load, but the decision on which current flow direction is selected is based on load current, not on load voltage.

Figure 1:
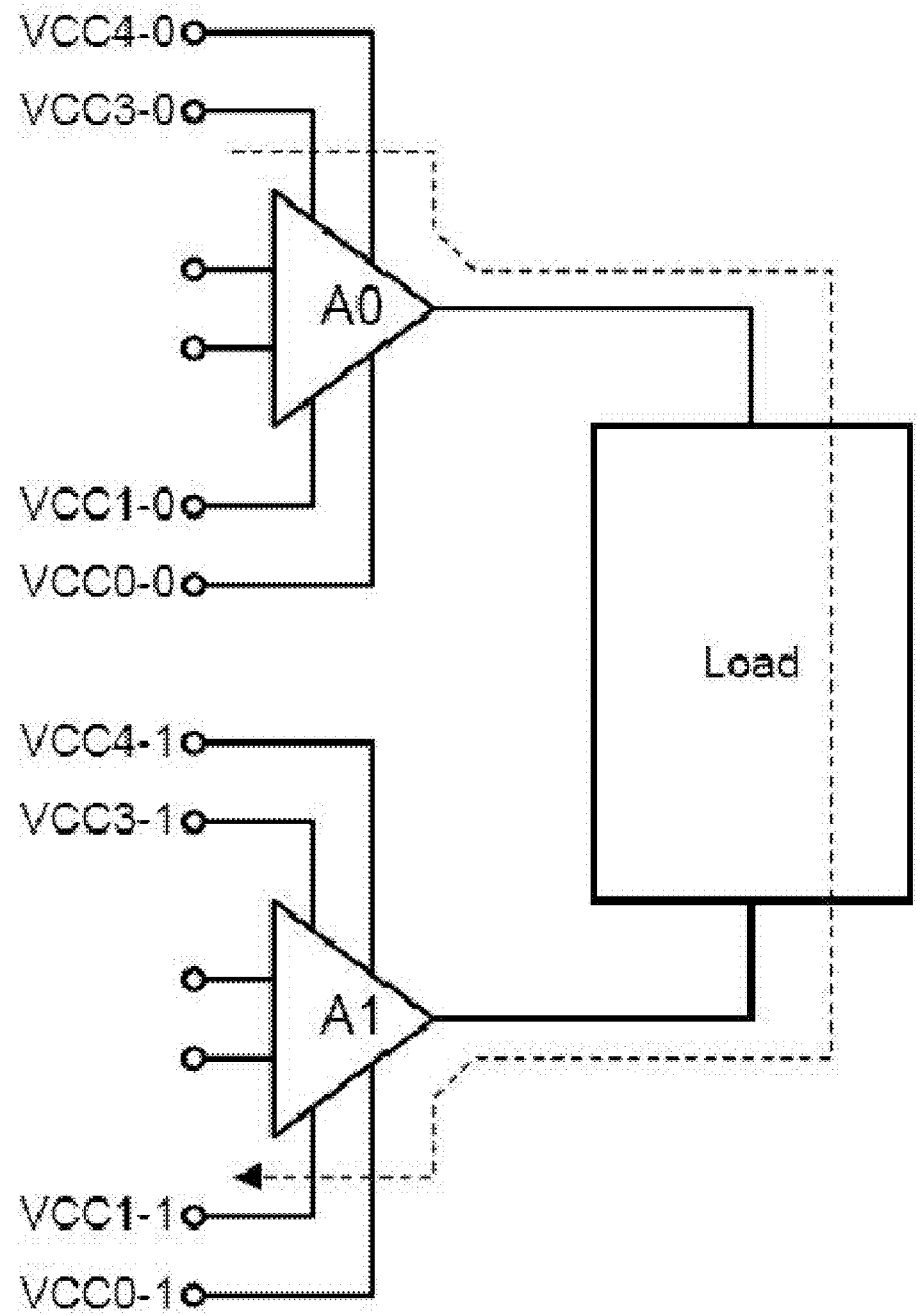
FIGS. 1-2 illustrate generally examples of amplifier configurations.
Figure 2:
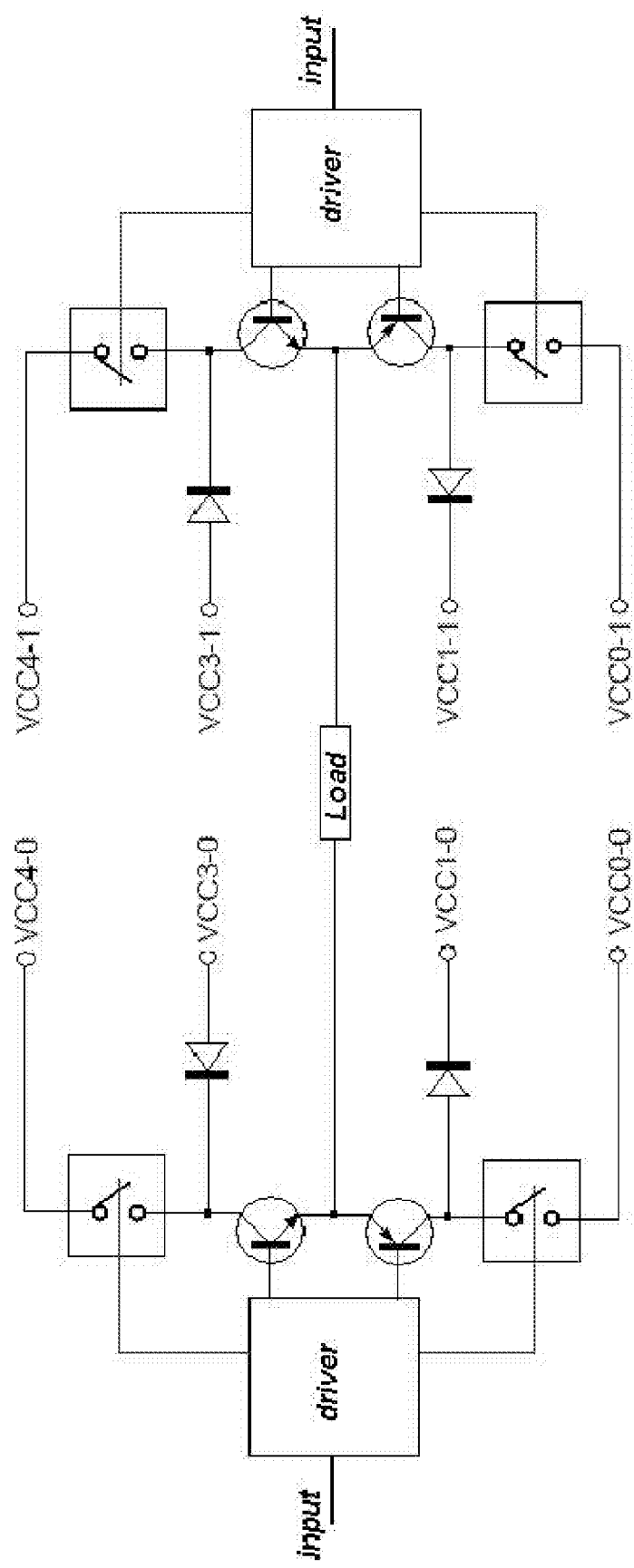
Figure 3:
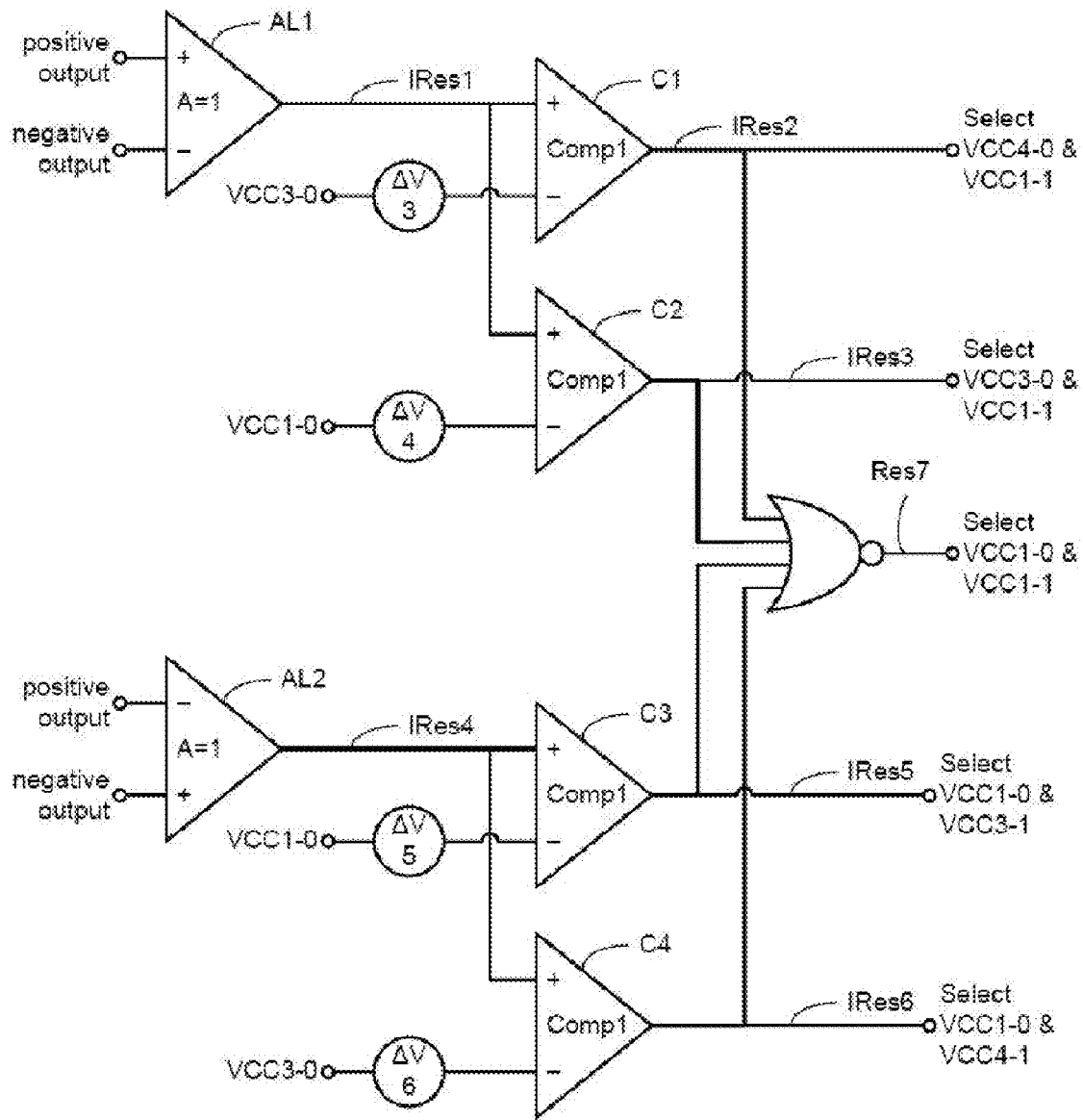
FIG. 3 illustrates generally an example of a rail selector.
Figure 4:
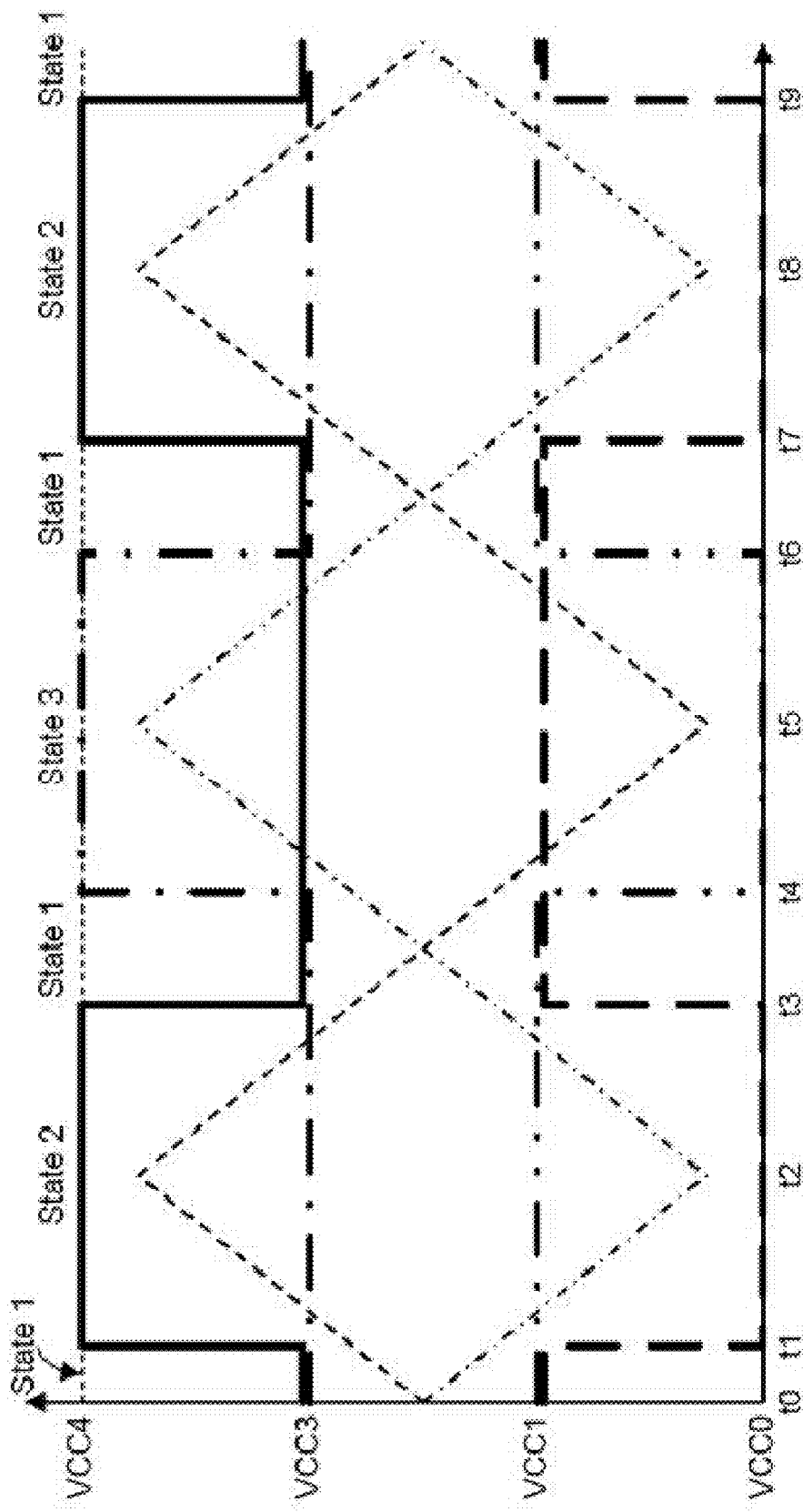
FIGS. 4-5 illustrate generally example waveforms associated with the amplifier configurations of FIGS. 1 and 2.
Figure 5:
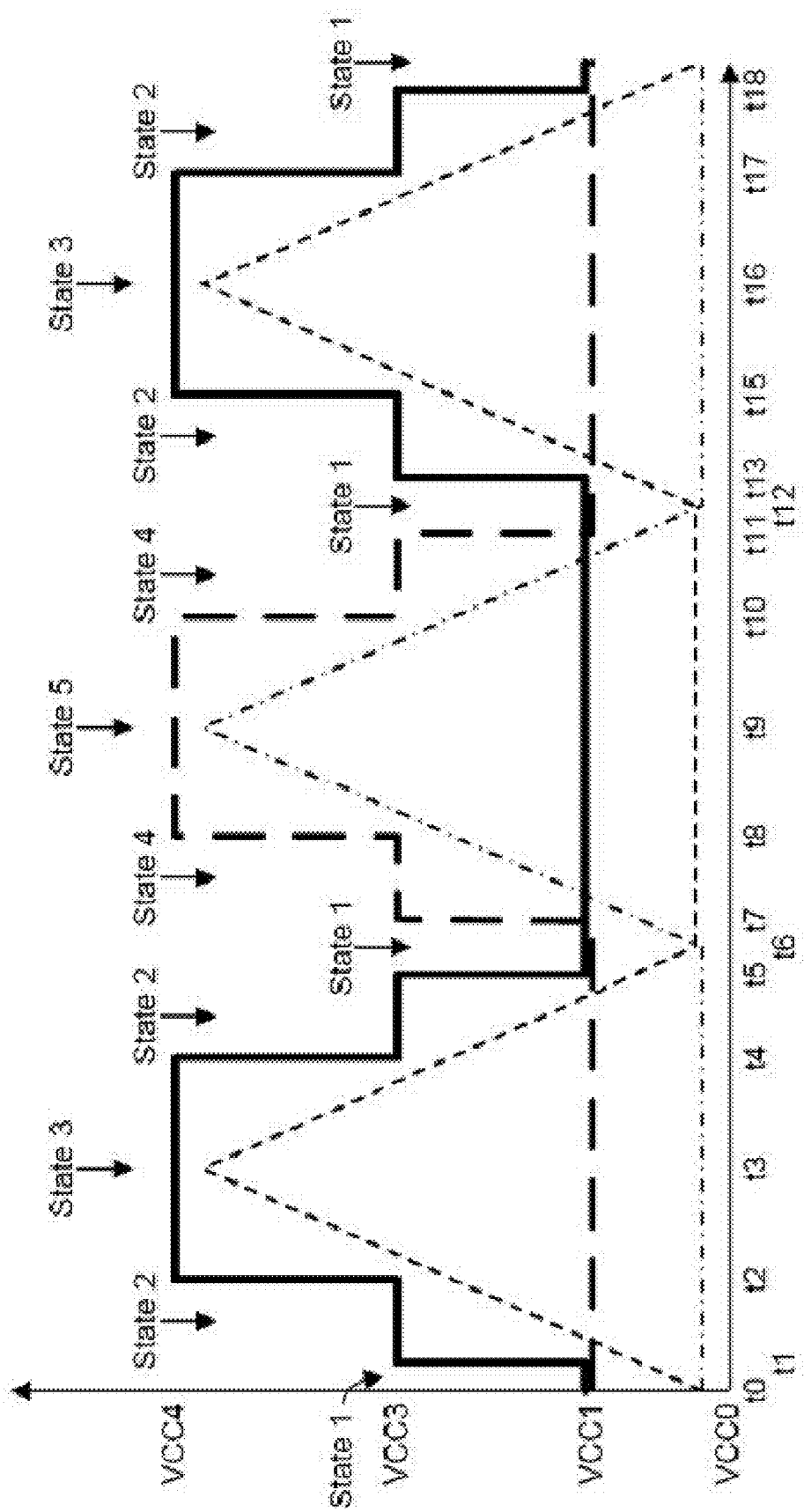
Figure 6:
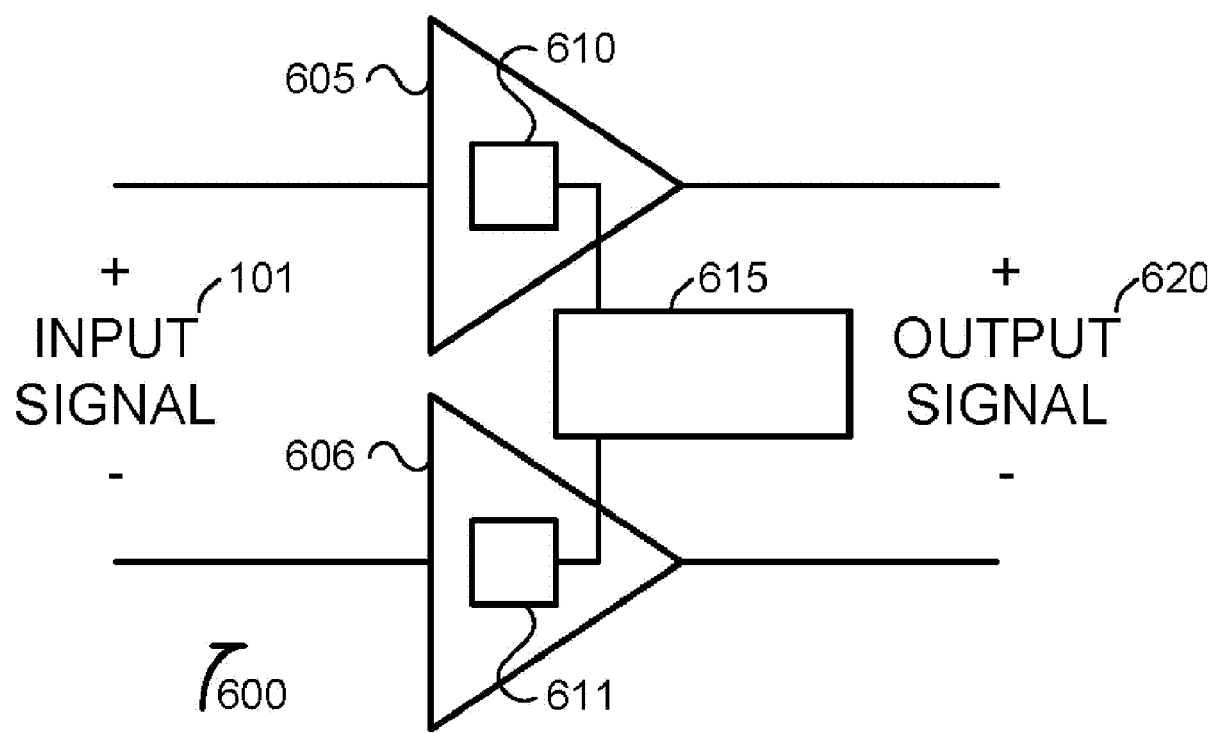
FIGS. 6-8 illustrate generally examples of bridge-tied load (BTL) amplifier configurations.

FIG. 6 illustrates generally an example of a BTL amplifier system 600 including a first amplifier 605 and a second amplifier 606 configured to receive an input signal 101 and to produce an output signal 620, and digital logic circuitry 615 configured receive an indication of an output current in a load and to select a current drive direction of the first and second amplifiers using the received output current information. In an example, the BTL amplifier system 600 can be configured to drive a purely resistive load, or the BTL amplifier system 600 can be configured to drive an at least partially reactive load (e.g., a load having an output current at least partially out of phase with an output voltage).

In an example, the first amplifier 605 can include a first output stage 610, and the second amplifier 606 can include a second output stage 611. In certain examples, one or more of the first output stage 610 or the second output stage 611 can be included as a portion of the first amplifier 605 or the second amplifier 606. In other examples, one or more of the first output stage 610 or the second output stage 611 can include components separate from the first amplifier 605 and the second amplifier 606.

In an example, the first output stage 610 and the second output stage 611 can each include a pull-up device configured to draw current from a first power rail and a pull-down device configured to sink current into a second power rail. In certain examples, the first amplifier 605 and the second amplifier 606 can be configured to alternate between a pull-up mode and a pull-down mode, each of the first amplifier 605 and the second amplifier 606 amplifying substantially half of a full wave output signal. In an example, one or more of the pull-up device or the pull-down device can include an n-type device, and not a p-type device (e.g., to maximize an available output swing).

In an example, the pull-up device can include a pull-up switch configured to draw current from and hold its output to a first power rail, and the pull-down device can include a transconductive pull-down device configured to sink a variable current into a second power rail in response to a received input signal. In another example, the pull-up device can include a transconductive pull-up device configured to draw a variable current from the first power rail in response to a received input signal, and the pull-down device can include a pull-down switch configured to sink a current to and hold its output to a second power rail.

In an example, the digital logic circuitry 615 can be configured to receive an indication of output current in a load. In an example, the BTL amplifier system 600 can include a current sensor configured to sense an output current, or to sense a current through a load. In certain examples, the output current can include an output current at least partially out of phase with an output voltage in the load.

In an example, the BTL amplifier system 600 can include a class-G BTL amplifier configuration (or one or more other types of amplifier configurations). In this example, the first and second power rails can include one of a plurality of available power rails. In certain examples, the BTL amplifier system 600 can include, or can receive information from, a voltage sensor configured to sense an output voltage, or to sense a target output voltage. The digital logic circuitry 615 can be configured to receive an indication of a target output voltage in a load and to select the first and second power rails for each of the first amplifier 605 and the second amplifier 606 from the plurality of available power rails using the received output voltage information (e.g., to minimize a voltage drop between the selected first and second power rails and the received target output voltage information).

Figure 7:
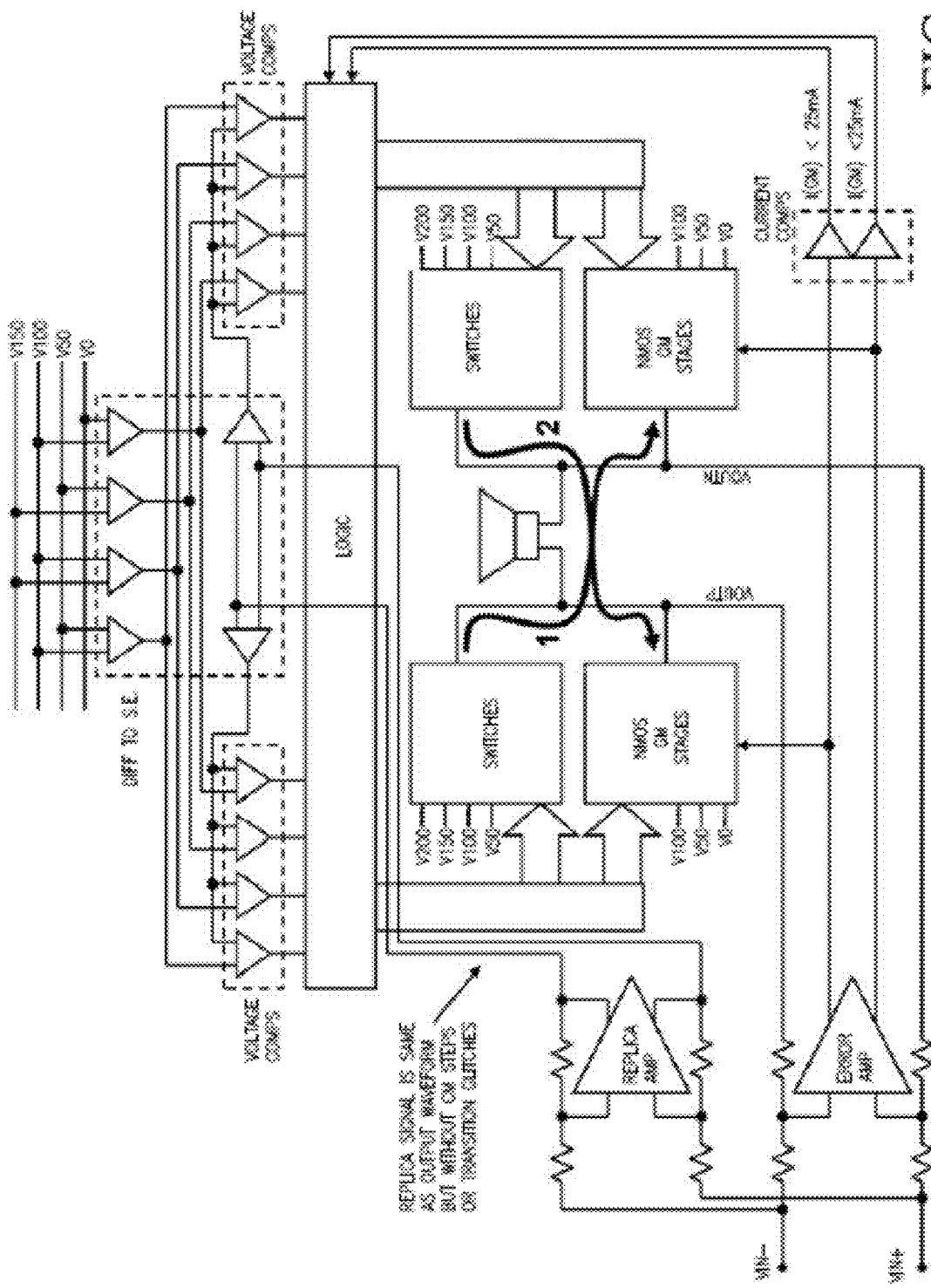
Figure 8:
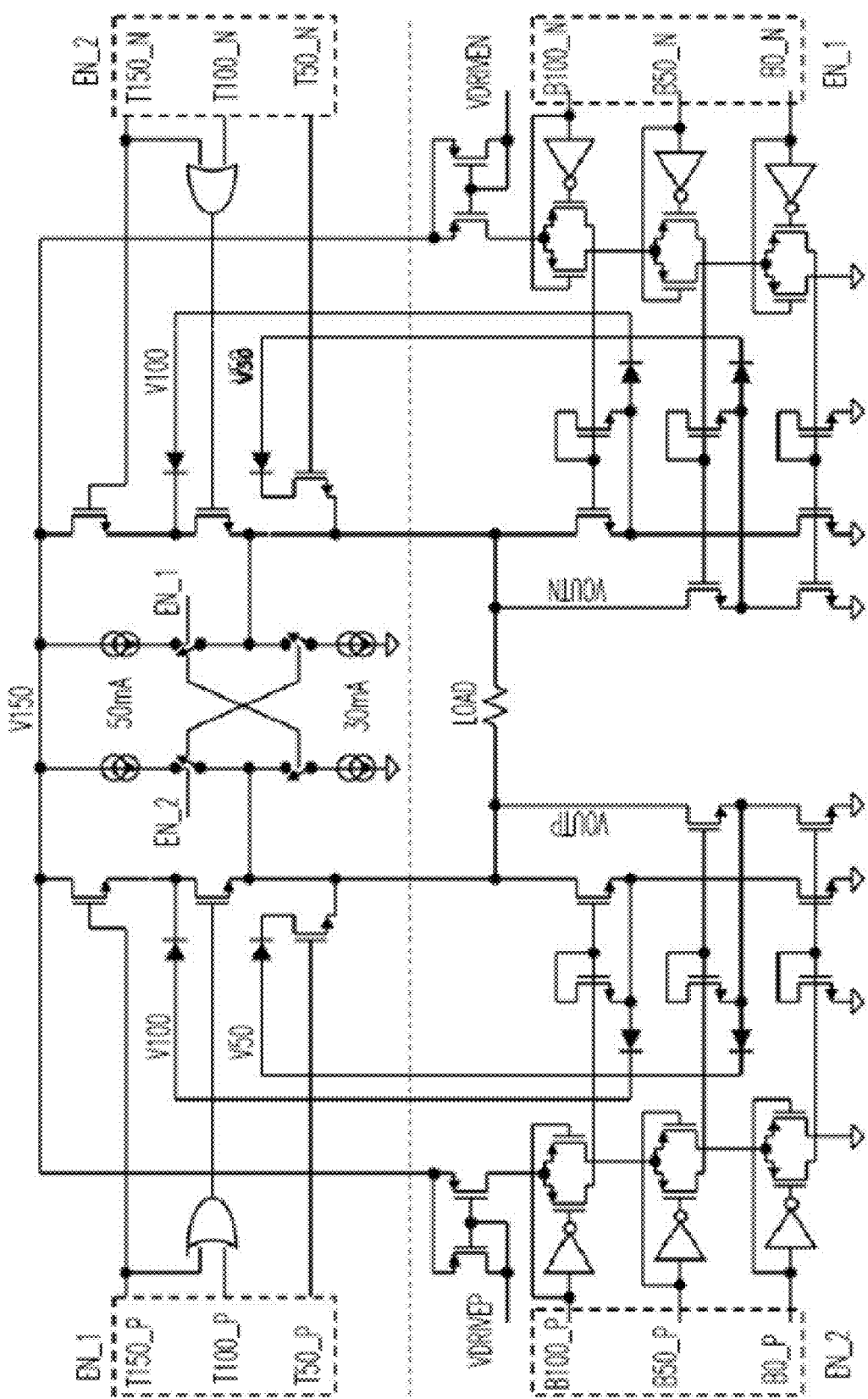
Figure 9:
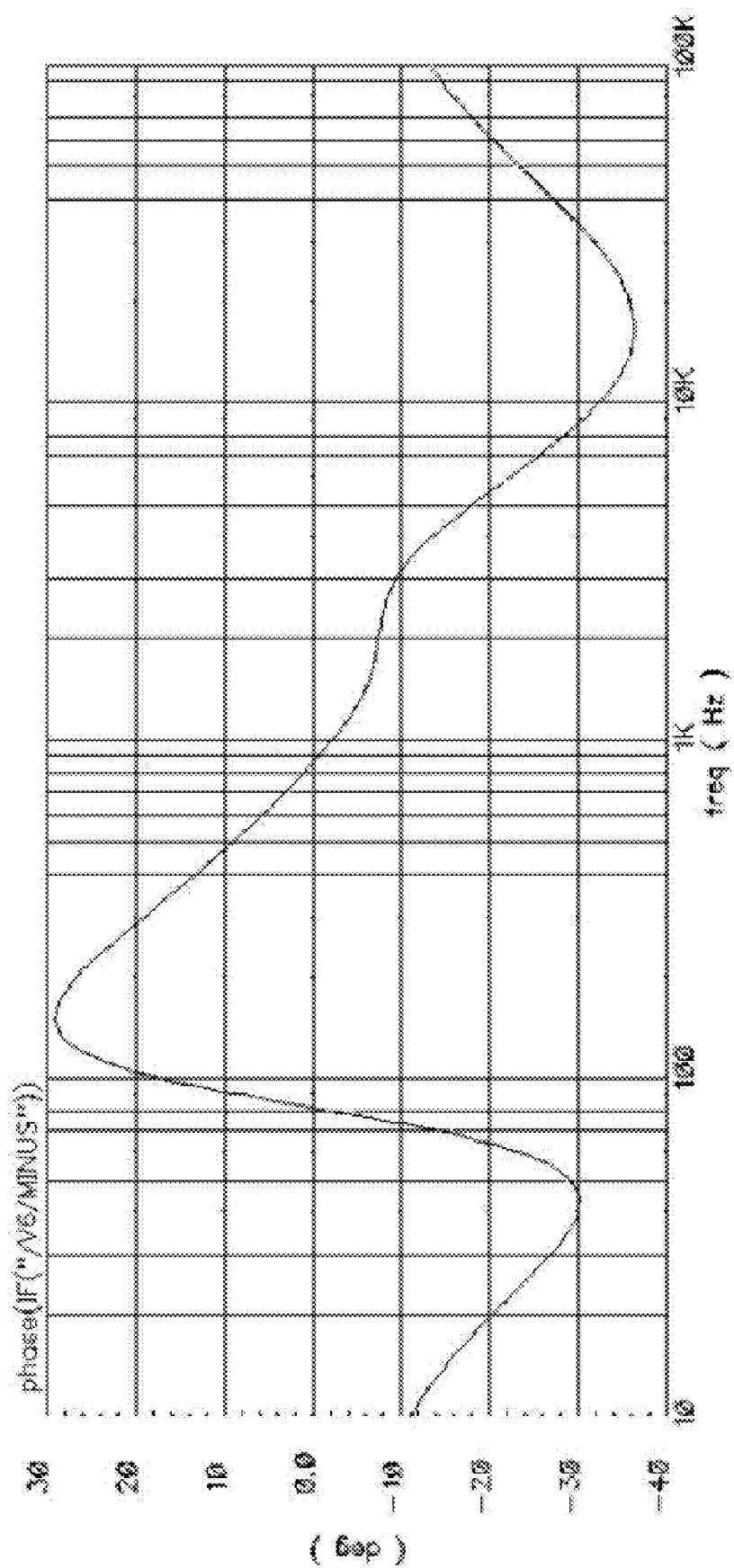
FIG. 9 illustrates generally an example of a phase relationship between a current and a voltage in an example load.

FIGS. 7-8 illustrate generally examples BTL amplifier systems. In these examples, the core of the amplifiers include area-efficient n-type output stages whose pull-up switches can draw current from any one of an assortment of class-G power rails, as well as transconductance pull-down devices which can sink current into any one of an assortment of the same or different class-G supply rails. At any given time, either the left side pull-up switches and the right side Gm pull-down stages are enabled (EN1=1 and EN2=0), supporting current path 1 from left to right, or the right side switches and the left side Gm stages are enabled (EN1=0 and EN2=1), supporting current path 2 from right to left. In other examples, the role of the pull-up devices and the pull-down devices can be reversed.

In these examples, the decision on which current direction is supported, which supply rail is used by the pull-up switches, and which supply rail is used by the pull-down Gm stages, is controlled by digital logic circuitry. In other examples, the digital logic circuitry can include one or more other components, including one or more processors or controllers each configured to perform at least a portion of a given set of instructions.

In the examples of FIGS. 7-8, the logic block is fed information from a set of differential-to-single-ended voltage converters and voltage comparators that together indicate which two of the plurality of class-G rails the differential output voltage will "fit" in between at any given instant, and thus allow the logic block to select which output devices should be enabled to allow current to flow from the first of these two rails, through the load, and into the second rail. A replica of the desired or target differential output voltage, rather than the actual differential amplifier output, is used to feed the comparator section in order to avoid any potential decision problems that might be caused by the inherent common mode steps and transient glitches that occur at the main outputs as the amplifier switches between operating modes and among supply rail selections. Also feeding the control logic block are two current comparators that are coupled to the drive inputs of the NMOS Gm stages and which indicate when the output current of each of the NMOS Gm stages is above or below a given threshold (in this case, 25 mA). In other examples, one or more other type of Gm stage other than NMOS can be used. These current comparators work in conjunction with the 50 mA and 30 mA constant current sources shown in FIG. 8 to allow the amplifier configuration to detect when a current reversal has occurred in the load, regardless of the instantaneous voltage across the load. In other examples, one or more other current sources (e.g., different values, different type, such as variable, etc.) can be used in conjunction with, or in place of one or more of the 50 mA or the 30 mA constant current sources.

Current Reversal Detection Example

As an example of current reversal detection, in the amplifier configuration of FIG. 8, assume that current is flowing in the direction of path 1 (left to right, EN1=1, EN2=0), out of the left-side switches and into the right-side NMOS Gm stages, with a magnitude of 100 mA. In this example, all currents in the right-side switches and left-side NMOS Gm stages are zero (switched off). An additional 50 mA is flowing into the right-side NMOS Gm stages due to the EN1-enabled 50 mA current source, for a total of 150 mA. The left-side switches are supporting 130 mA due to the load current plus the EN1-enabled 30 mA current sink. If the load current ramps down to 0 mA, the right side NMOS Gm stages current ramps to 50 mA, and the left-side switches current ramps to 30 mA. Continuing on its negative trajectory, the current in the load ramps until it has reached a reversed value of −25 mA, while the amplifier remains in the current path 1 mode (EN1=1, EN2=0). At this point, the current in the right-side NMOS Gm stages has reached 25 mA, crossing the threshold of the associated current comparator. Now, the current in the left-side switches has diminished to 5 mA at this point but has not reversed, and is sufficient for its purpose of maintaining forward biasing of the NMOS devices and rectification diodes while also sinking the now reversed current in the load. Under these conditions, the comparator trips indicating to the control logic that the current in the load has passed through zero and reversed by 25 mA. The control logic then swaps the states of EN1 and EN2, and the amplifier reconfigures itself to conduct current from the right-side switches, through the load, and into the left side NMOS Gm stages (current path 2). The action of the loop comprised of the error amplifier and the Gm stages rapidly adjusts to any imbalance caused by this reconfiguring of the amplifier in order to maintain an unchanged voltage (and therefore −25 mA current flow) in the load. Thus, after the reversal transition, all currents in the left-side switches and right-side NMOS Gm stages are zero (or substantially zero), the current in the right-side pull-up switch is 55 mA, and the current in the left-side NMOS Gm pull-down stage is 75 mA (50 mA above the 25 mA trip point of its associated current comparator). The current in the load can continue to increase in its reversed direction and the amplifier can handle the increased current as normal. If the current ramp turns around and begins trending in the opposite direction (toward zero and another reversal), it will again have to fully pass through zero and reverse by 25 mA in order to trip the amplifier turn-around mechanism in a fully complementary operation to the one just described.

The results of the incorporation of this current reversal detection scheme described above are twofold. First, the one-way nature of the current drive in this class-G configuration will not hamstring proper voltage amplification by working in the wrong direction because the determination of the appropriate amplifier current drive direction is regulated by the actual current needs of the load and not by the voltage across it. Second, because the current must pass through zero and reverse by a pre-determined amount before the amplifier reverses its current drive direction, hysteresis is inherent. Hysteresis can be useful in avoiding continuous, rapid-fire amplifier reversals in the presence of low-level noise or very small voltage signals that produce many, closely-spaced zero-crossings of the output voltage (and potentially of the output current) that the amplifier current drive direction control mechanism would otherwise attempt to follow.

Figure 10:
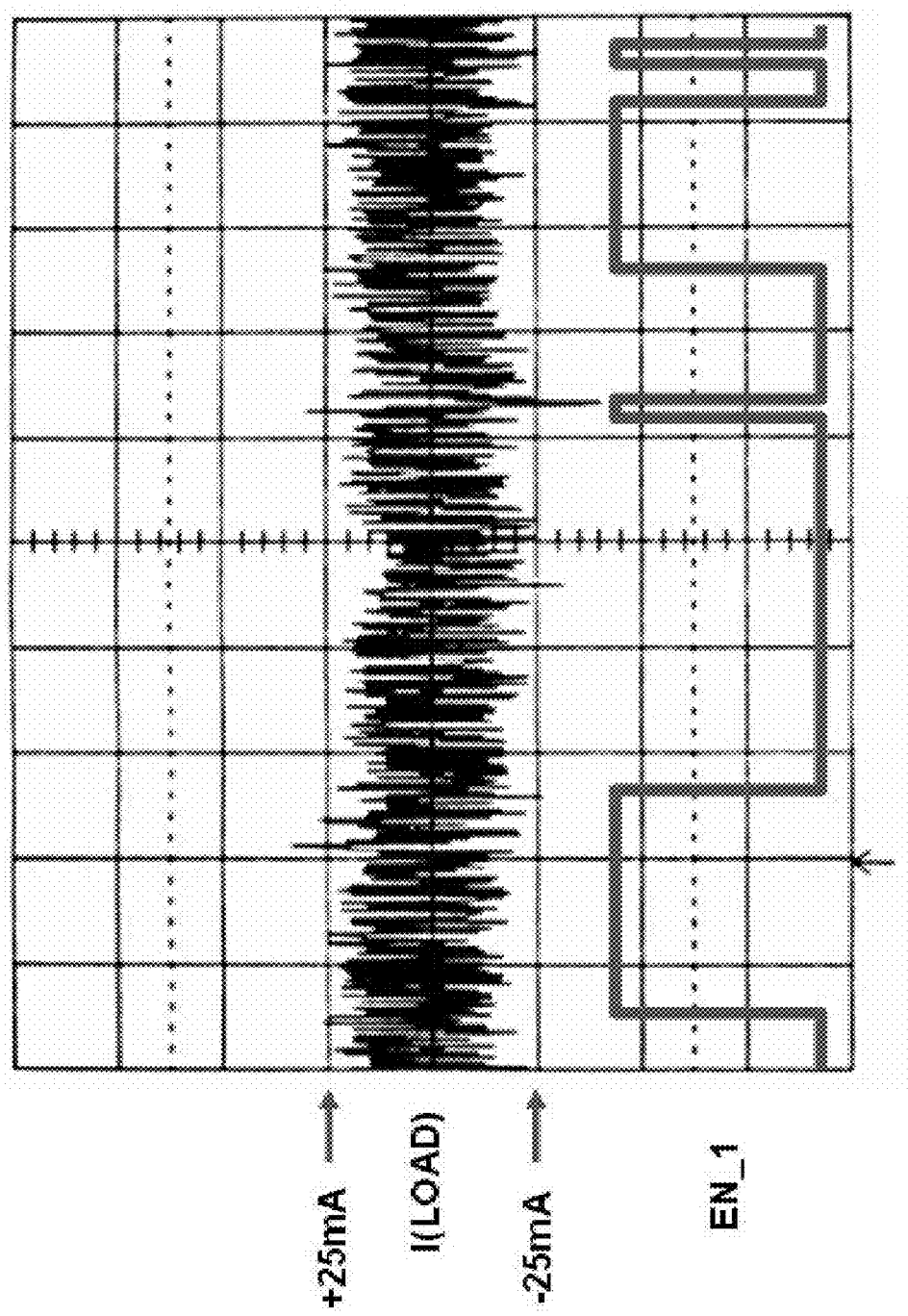
FIG. 10 illustrates generally an example of waveform illustrating reversal detection and hysteresis.

FIG. 10 illustrates generally an example of waveform illustrating reversal detection in the presence of a noisy amplified signal with 25 mA of hysteresis, as discussed above.

In certain examples, the above-described current reversal handling can be (and in certain examples, must be) independent of the load voltage. It remains the responsibility, however, of the output voltage sensing and range selection circuitry (e.g., translators, comparators, and control logic, such as shown in FIG. 7) to select the appropriate class-G power rail(s) from which the pull-up switches draw current and into which the pull-down transconductance devices sink current as a function of both the load voltage and the current drive direction. In an example, this can be necessary because the pull-up/pull-down supply rail selection needed for current flow in one direction is not necessarily the same as the pull-up/pull-down configuration needed for current flow in the opposite direction, particularly if the differential load potential is substantially non-zero at the point of amplifier reversal.

Class-G Operation Example

Figure 11:
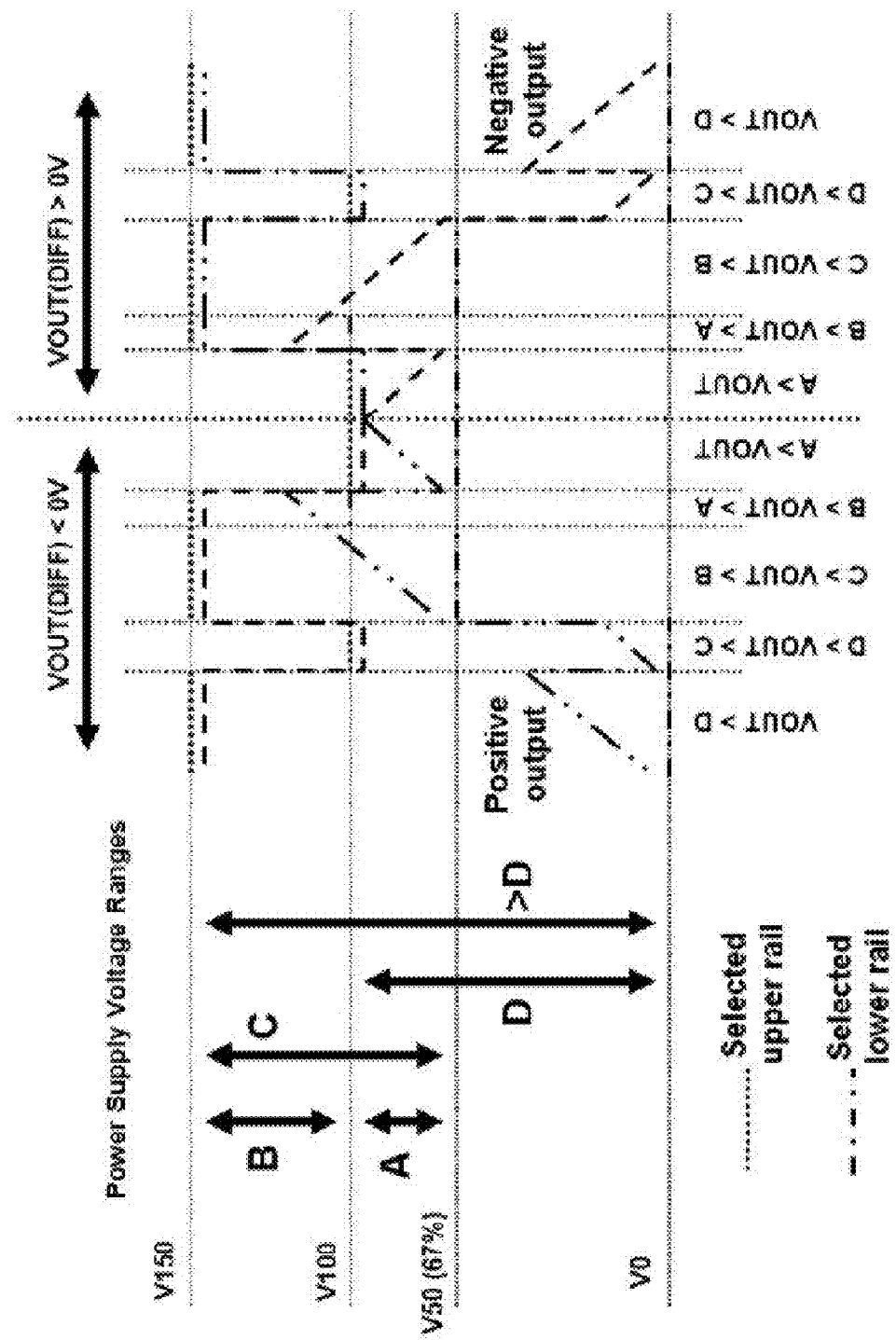
FIG. 11 illustrates generally an example of voltage domain behavior of a class-G amplifier configuration.

FIG. 11 illustrates generally an example of voltage domain behavior of a class-G amplifier configuration. In this example, a BTL class-G amplifier has five voltage ranges or domains in which each amplifier is allowed to operate, denoted "A", "B", "C", "D", and ">D", with "A" being the smallest voltage range, incrementing until the largest voltage range, ">D." FIG. 11 illustrates the voltage behavior of each of the amplifier outputs as a voltage ramp is passed through the amplifier from a fully negative differential value to a fully positive differential value. Also illustrated is a choice of power supply rails in use as the outputs pass through the five available class-G voltage ranges. Note that this particular class-G amplifier configuration exhibits steps in the common mode value of the output voltage as it experiences transitions between some of the ranges. These Vcm steps have no effect on the differential voltage seen by the load. Also, while this Vcm-agile behavior is a key element in U.S. Pat. No. 7,498,880, it is not necessary for the operation the BTL amplifier configured described herein. In fact, the BTL amplifier configuration described herein is not limited to the class-G implementation as shown in FIG. 11. Class-G implementation is used strictly as an example platform.

Figure 12:
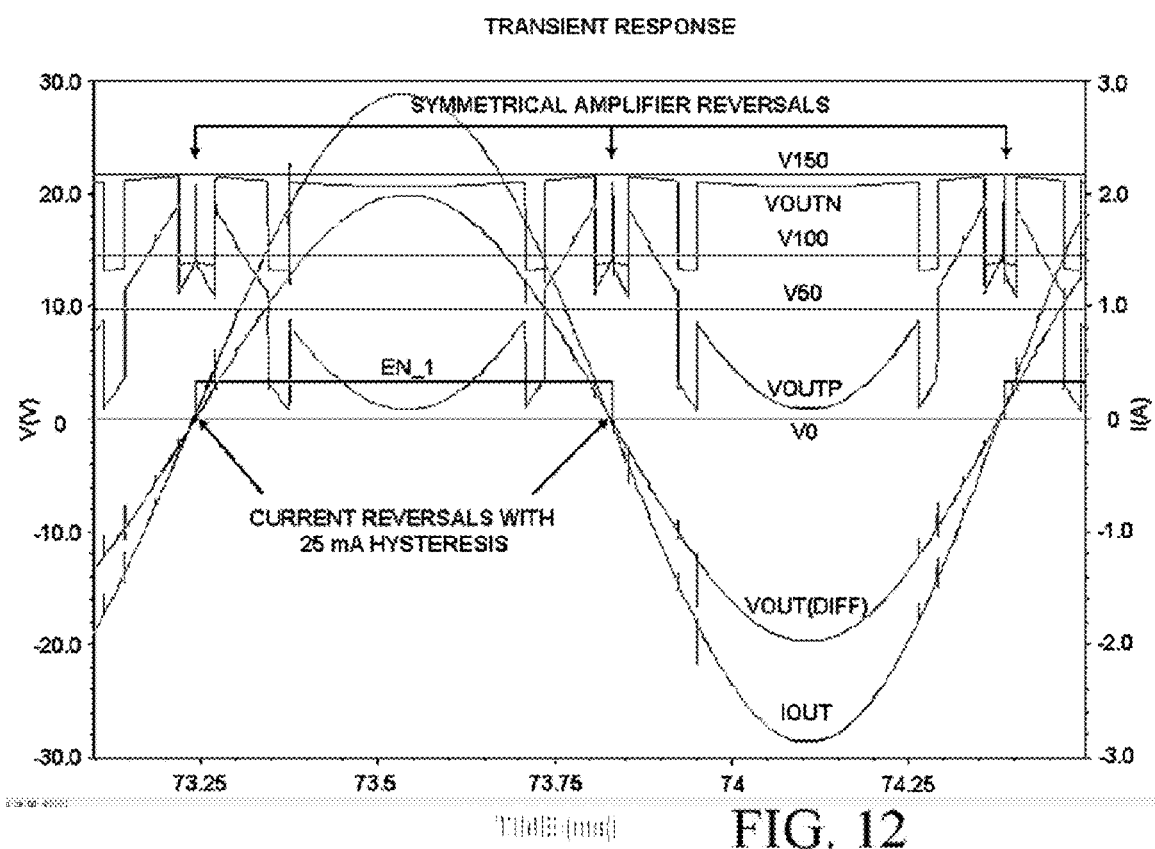
FIGS. 12-18 illustrate generally examples of amplifier operation in different load conditions.

FIG. 12 illustrates generally an example of amplifier operation in a purely resistive load condition (voltage and current in-phase). In this example, a sinusoidal signal is being passed by the amplifier. Here, the +25 mA reversal hysteresis is present, though its effect is only marginally visible given its small size in comparison to the large magnitude of the peak load current. The amplifier current driving direction reversals (indicated by EN_1 changing state) are essentially symmetrical about the point where VOUTP=VOUTN, with VOUTP and VOUTN both remaining within the "A" voltage range (between V12 and V8) each time a reversal occurs.

Figure 13:
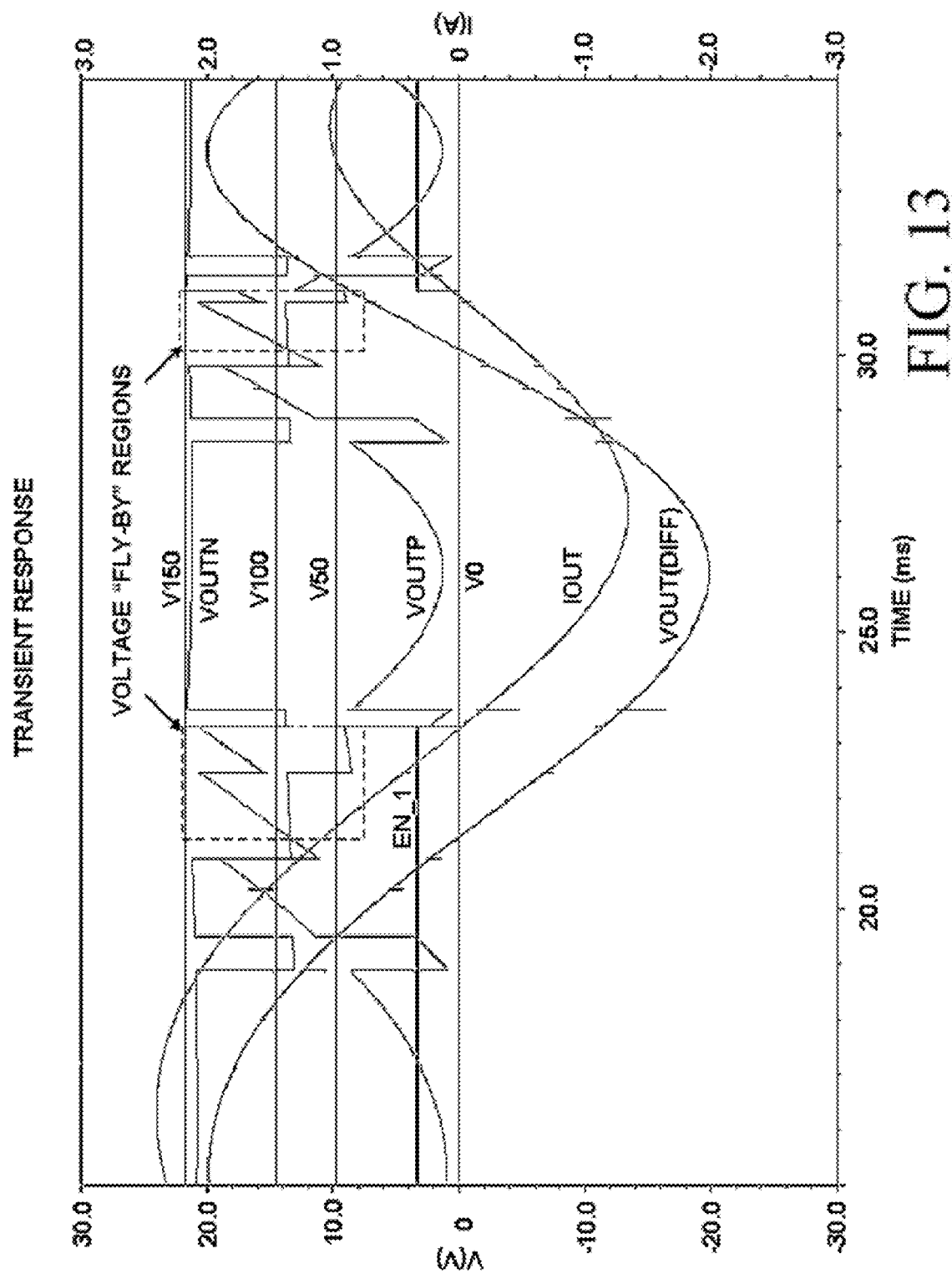

FIG. 13 illustrates generally an example of amplifier operation in a semi-inductive load condition with voltage leading current. Here, the differential output voltage passes through zero well before the current passes through zero and crosses the 25 mA hysteresis threshold. In this example, the amplifier driving direction reversal (EN_1 changing state) is held off until the load current reversal has been sensed. At the left edge of the first dashed box, unlike in the example of FIG. 12, the VOUTN output "flies by" the VOUTP output while the rail selection remains unchanged (e.g., VOUTP remains latched to V12 (with a visible Vd+I*Rdson voltage drop)) while load current continues to be sunk into V8 by the transconductance pull-down device. In fact, as VOUTN continues on a positive trajectory, approaching V18 and risking clipping against that rail (e.g., due to the presence of NMOS bulk diodes), the range control circuitry appropriately changes the rail selection to a setting where V8 is used both as the latched sourcing rail for VOUTP and the transconductance pull-down sinking rail for VOUTN. This mode can be maintained until current reversal is sensed and the amplifier current drive mode is reversed. In this example, after amplifier reversal occurs, an entirely different selection of supply rails becomes appropriate, and thus, are engaged to support the load current, as VOUTN is latched to V12 and VOUTP passes current through a pull-down device conducting into V0.

Figure 14:
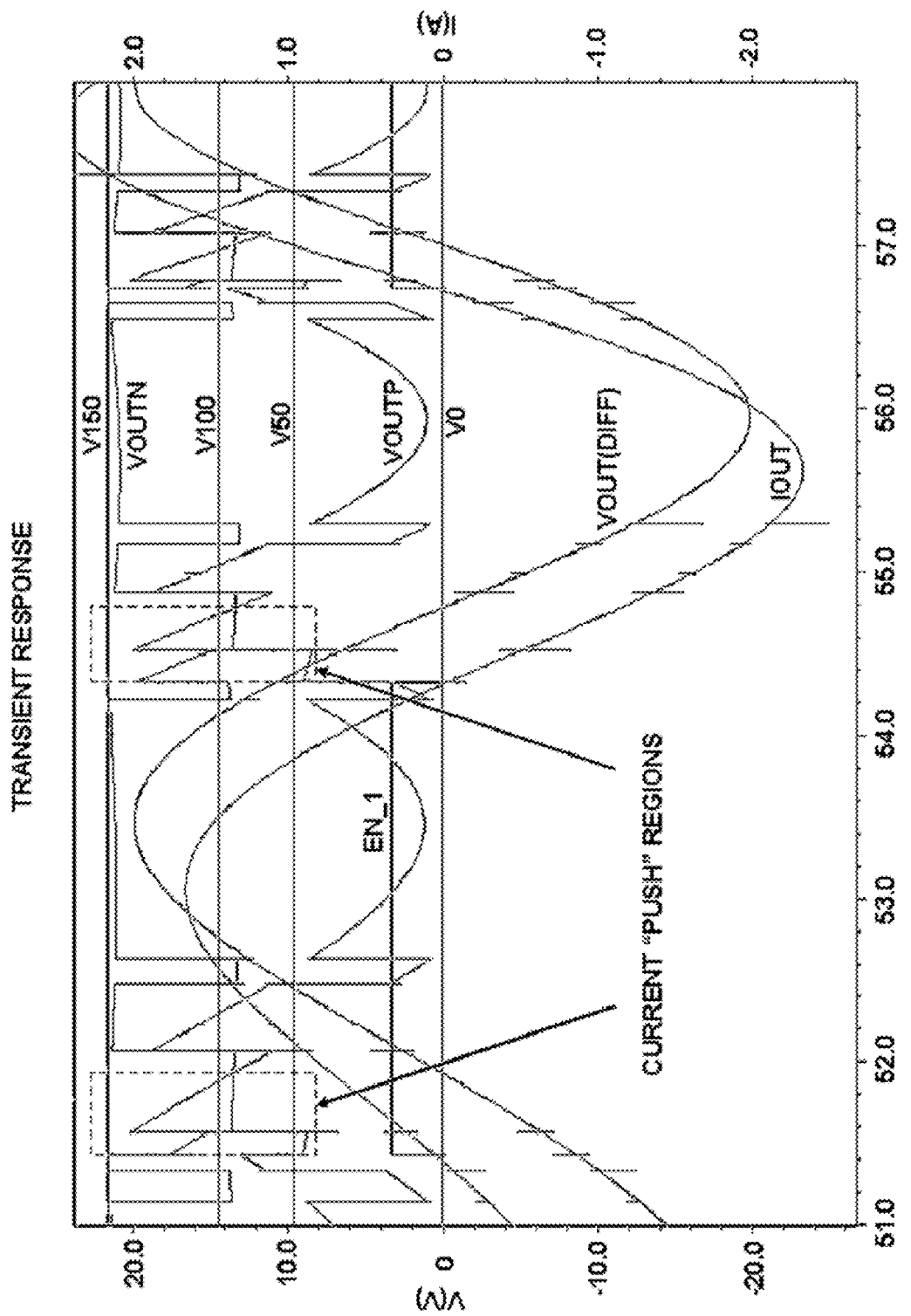

FIG. 14 illustrates generally an example of amplifier operation in a semi-capacitive load condition with voltage lagging the current. Here, the differential output voltage passes through zero well after the current passes through zero and crosses the 25 mA hysteresis threshold. As in the example of FIG. 13, the selection of supply rails appropriate for handling the output current immediately before and immediately after the amplifier current drive reversal are quite different from one another. Also, as was the case for a short period of time in the inductive example, V8 is being used both as the latched sourcing rail for one amplifier output (with visible Vd+I*Rdson drop) and as the transconductance pull-down sinking rail for the opposite output. In the example of FIG. 14, this occurs just after current reversal rather than just before reversal.

FIGS. 15-18 illustrate generally a more detailed example of amplifier operation in accordance with the examples of FIGS. 12-14. FIGS. 15-18 illustrate generally example outputs of voltage comparators in the example of FIG. 7 (not all comparators are shown or labeled). Here, GT_A_P through GT_D_P indicate when the (target) output voltage traverses range boundaries A, B, C, and D in the positive direction, and REV_P indicates when the voltage has reversed by a predetermined magnitude. Further, the output of voltage comparators GT_A_N through GT_D_N indicate when the (target) output voltage traverses range boundaries A, B, C, and D in the negative direction, and REV_N indicates when the voltage has reversed by a predetermined magnitude. (The REV_P and REV_N signals can be employed to enable the simultaneous use of a single class-G power rail by both the pull-up switches and the pull-down devices during the "flyby" or "push" events described in the examples of FIGS. 12-14, above.)

FIGS. 15-18 also illustrate the decoding of the comparator outputs into the appropriate control signals used to select the left-side pull-up switches T50P, T100P, and T150P, and right-side pull-down devices B0N, B50N, and B100N, as well as the appropriate control signals used to select the right-side pull-up switches T50N, T100N, and T150N, and right-side pull-down devices B0P, B50P, and B100P ("T" referring to "top" and "B" referring to "bottom", and the numerical designations 0, 50, 100, and 150 referring to percentages of a nominal system supply voltage). When EN1=1 (EN2=0), the amplifiers are configured to drive current from left to right, and T50P, T100P, T150P, B0N, B50N, and B100N are enabled while T50N, T100N, T150N, B0P, B50P, and B100P are ignored (treated as logic-0). The converse is true when EN1=0 (EN2=1).

Figure 15:
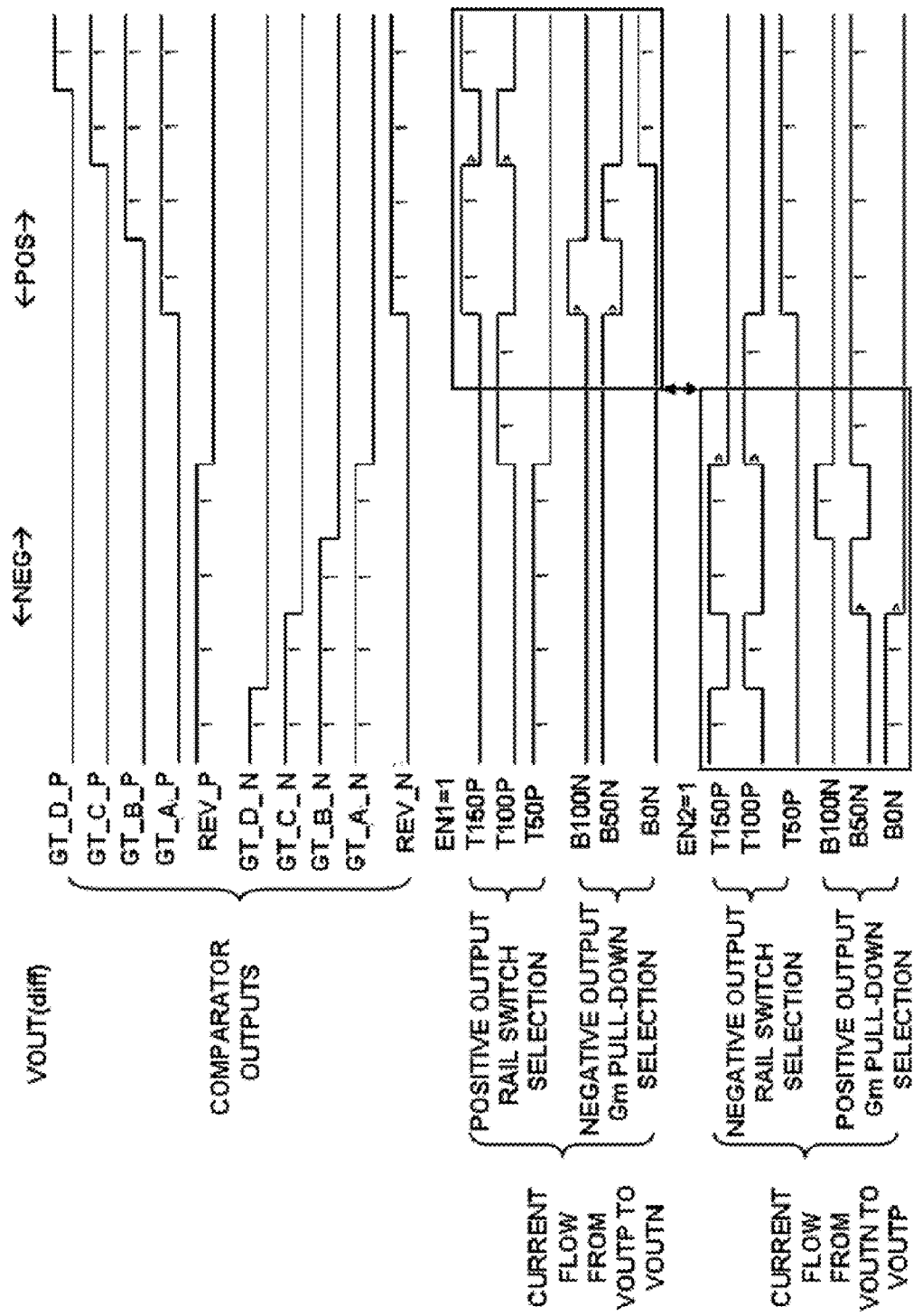
Figure 16:
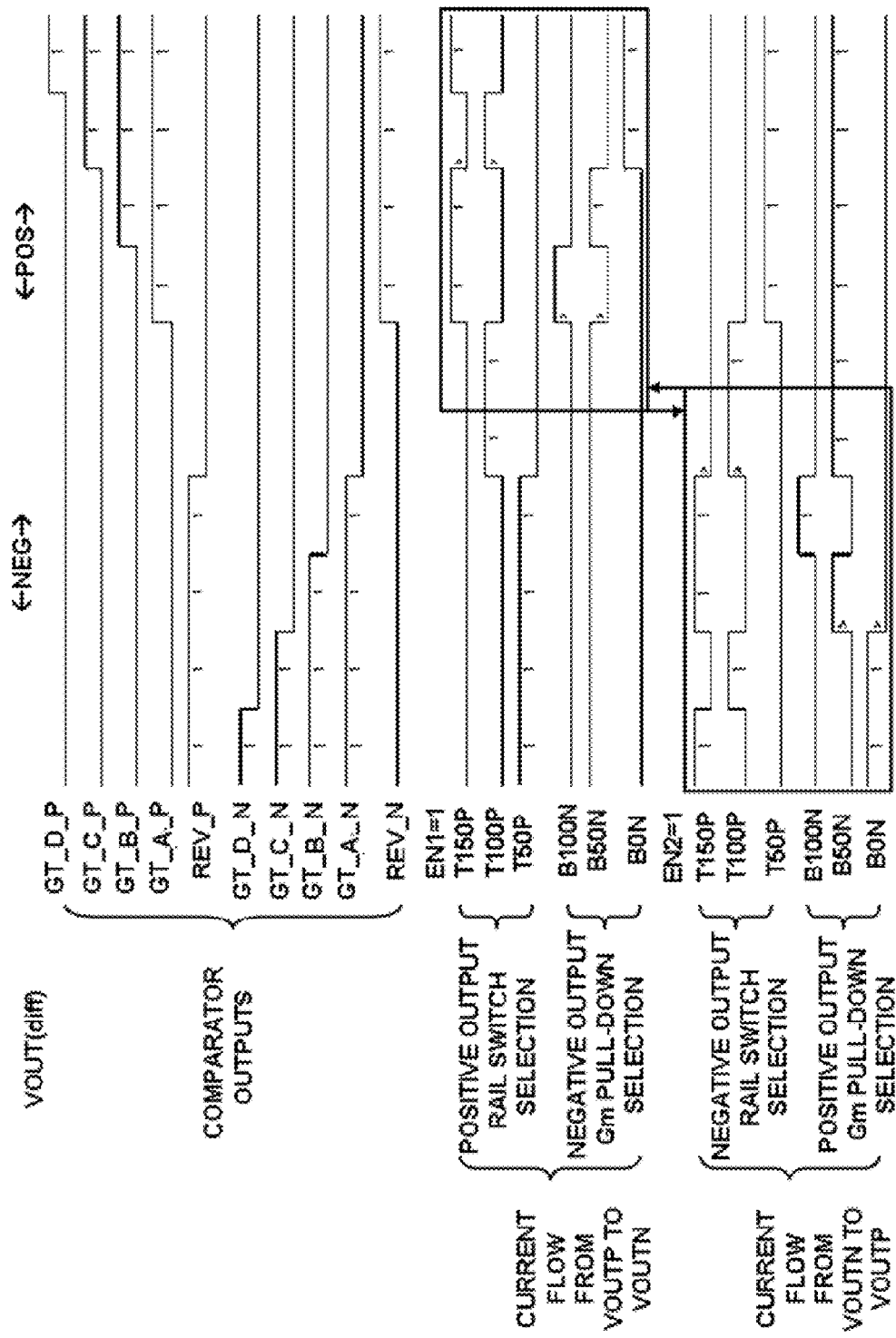
Figure 17:
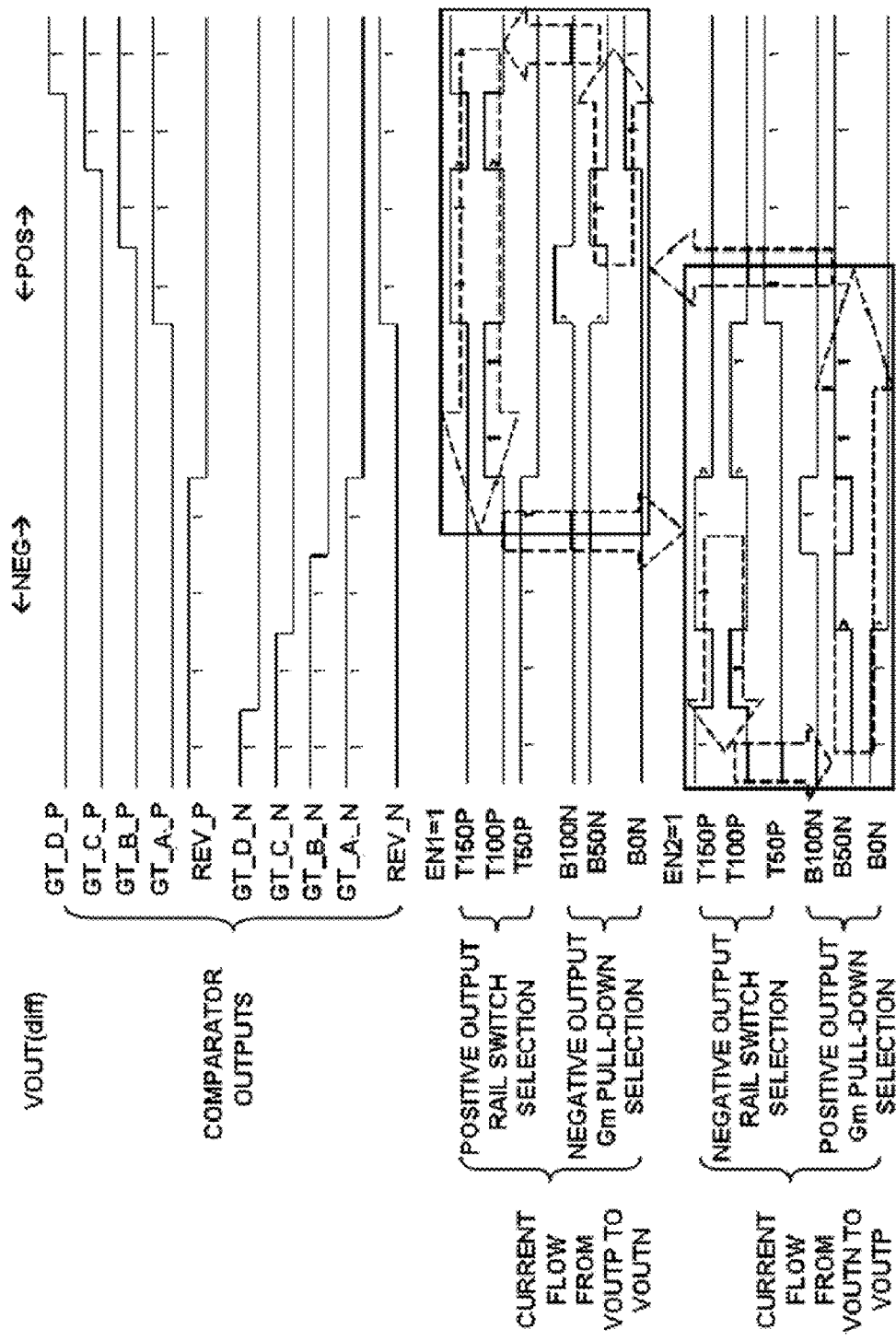
Figure 18:
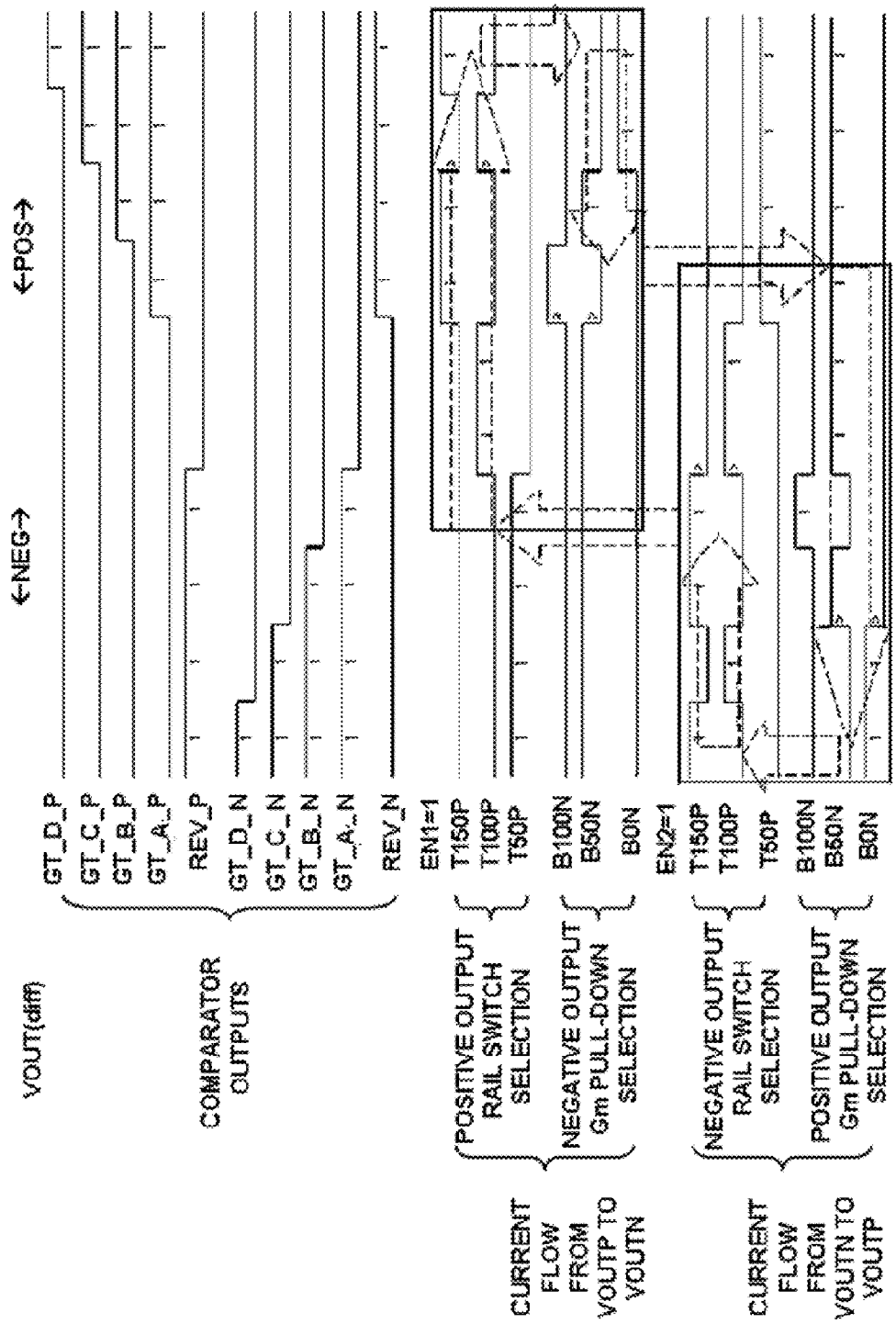

FIG. 15 illustrates generally an example of amplifier operation with a resistive load and no hysteresis. FIG. 16 illustrates generally an example of amplifier operation with a resistive load and hysteresis included. FIG. 17 illustrates generally an example of amplifier operation with a semi-inductive load. FIG. 18 illustrates generally an example of amplifier operation with a semi-capacitive load.

Figure 19:
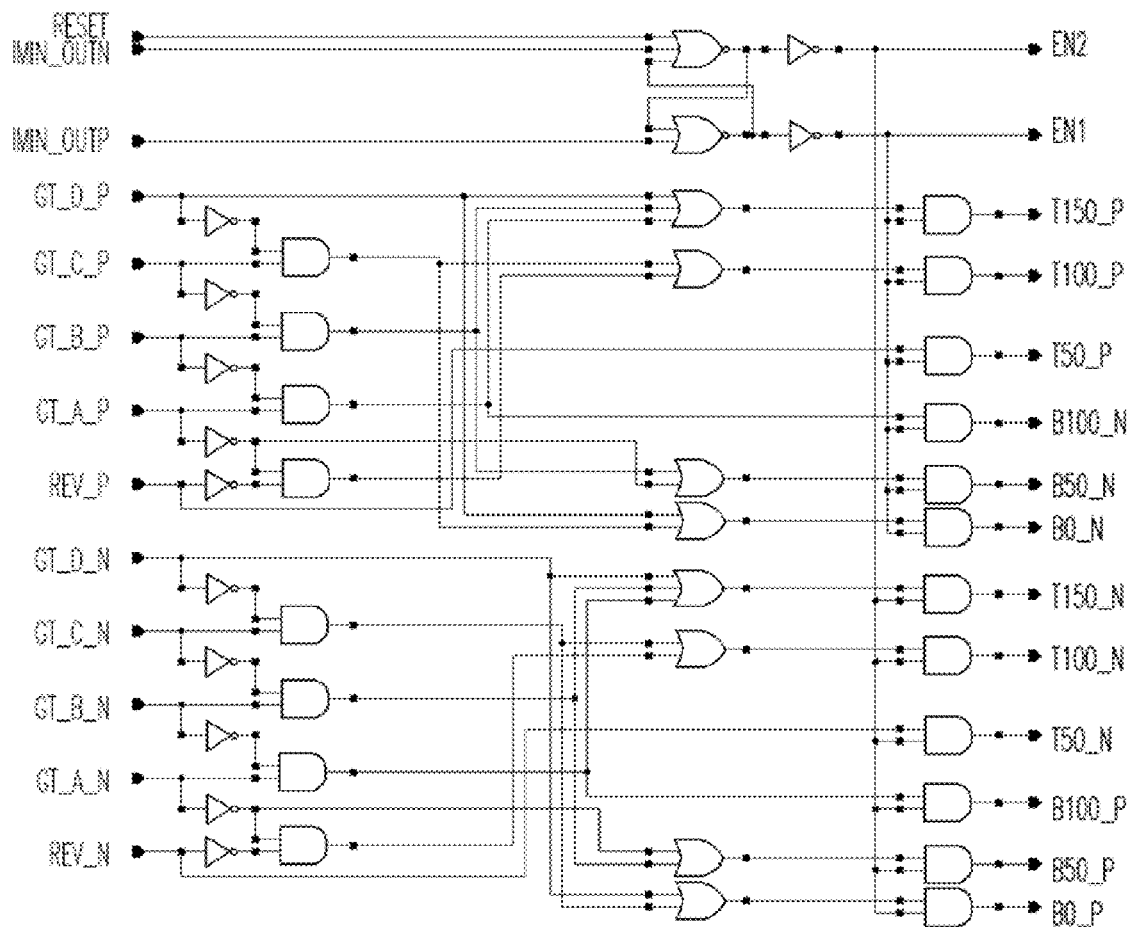
FIG. 19 illustrates generally an example of logic circuitry used to convert comparator outputs to class-G output stage control signals.

FIG. 19 illustrates generally an example of logic circuitry used to convert comparator outputs to class-G output stage control signals.

Figure 21:
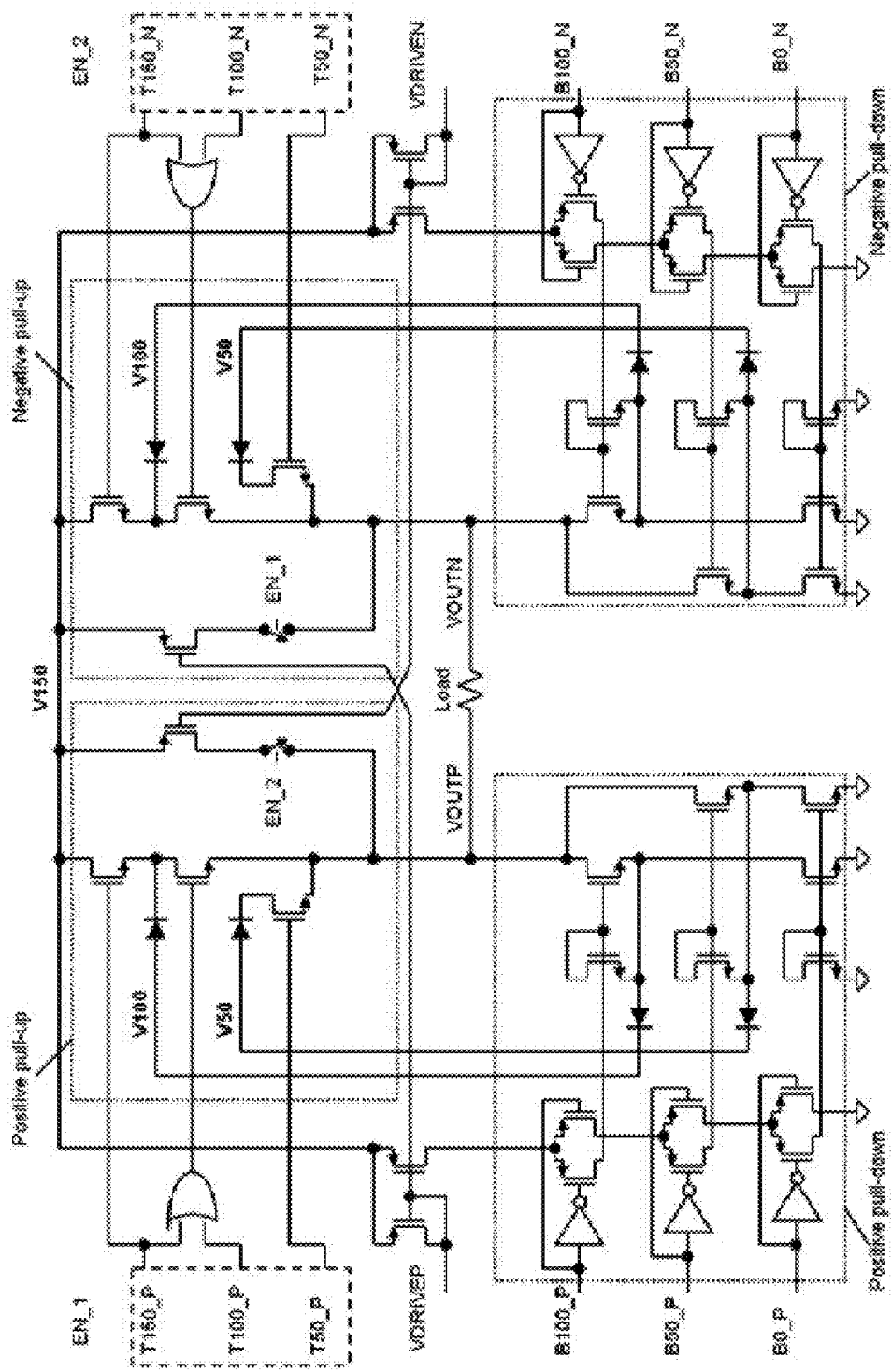
FIGS. 21-27 illustrate generally examples of a BTL amplifier configuration, subsequent operation, and accompanying modified control logic.

In other examples, the gated 50 mA current sources of FIG. 8 can be replaced with PMOS current mirrors, and the gated 30 mA current sinks can be eliminated (see FIG. 21). In certain examples, the output current magnitude of each new PMOS current mirror can be controlled by an error amplifier, and can also be gated either on or off by the EN1/EN2 signals. The function of the now eliminated 30 mA sinks is filled instead by error amplifier-controlled conduction in the existing pull-down transconductance devices (e.g., by a normal signal path). In an example, the B100_[X], B50_[X], and B0_[X] pull-down control signals can no longer be gated by EN1/EN2, but rather pull-down conduction can be enabled and can be controlled solely based on the reflected VDRIVEP/VDRIVEN signals from the error amplifier. In this example, the B100_[X], B50_[X], and B0_[X] control signals continue, as in the previous example, to select the appropriate pull-down devices per the instantaneous voltage conditions at each output node, but do so now on a full-time basis.

Figure 20:
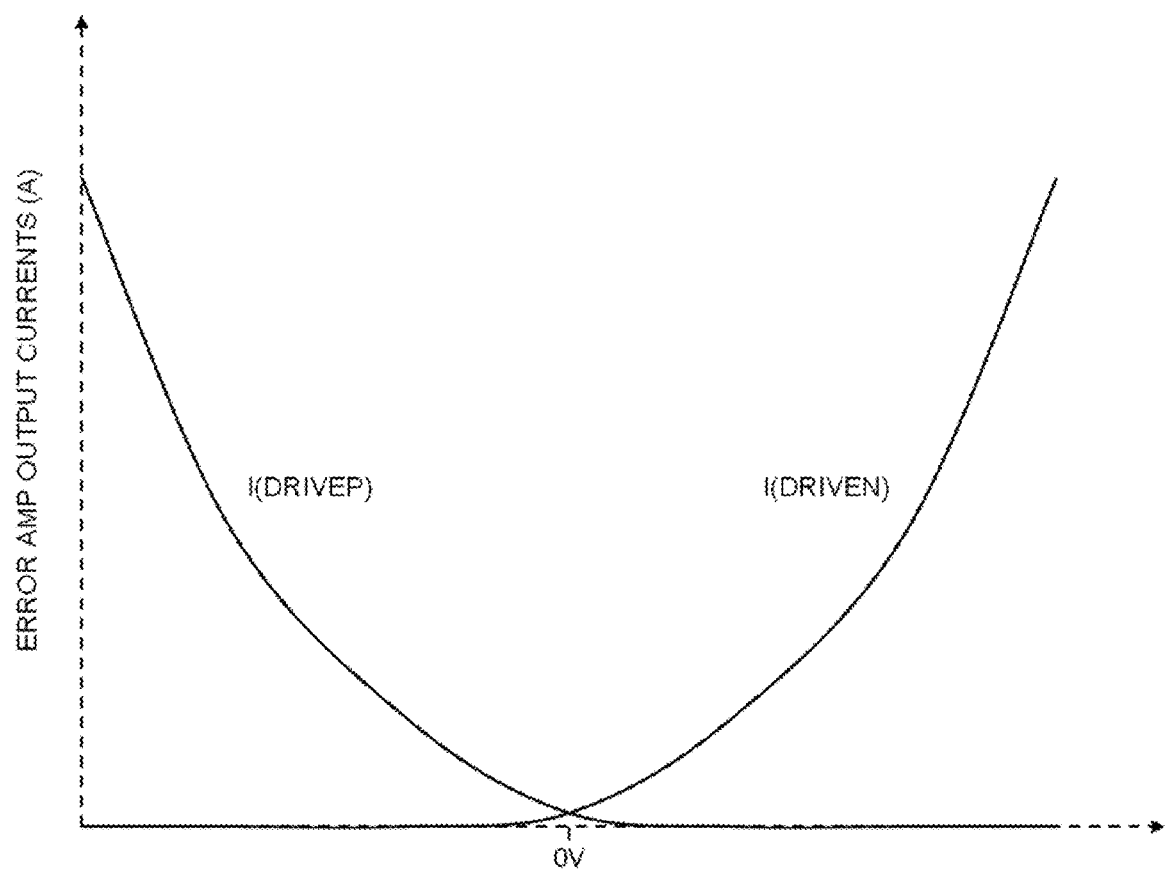
FIG. 20 illustrates generally a transfer function of an error amplifier.

FIG. 20 illustrates generally a transfer function of an error amplifier. In this example, when the differential input voltage is zero, the output currents are substantially equal and relatively low in magnitude. When the input voltage becomes non-zero, one output current tapers to zero while the other ramps up steeply. In an example, the error amplifier having this transfer characteristic can induce heavy conduction in one phase of the output stage while essentially shutting down the other, which is appropriate in the unidirectional configuration of the amplifier configuration of FIGS. 6-8, and can allow for the removal of the gating signals EN1 and EN2 from the output pull-down sections of the amplifier.

PMOS Configuration Example

FIG. 21 illustrates generally an example of a BTL amplifier configuration including two PMOS devices, one in each pull-up section. In this example, all previously existing 30 mA and 50 mA gated current sources, such as illustrated in FIG. 8, are removed. Here, the PMOS device in the positive pull-up section is biased by VDRIVEN identically to the negative pull-down section (equal magnitude currents), and is gated by EN2. The PMOS device in the negative pull-up section is biased by VDRIVEP identically to the positive pull-down section (equal magnitude currents), and is gated by EN1. In this example, the PMOS devices, though not as area-efficient as NMOS devices, need only handle currents of up to 75 mA.

Because of this, the PMOS devices are not physically large in comparison to NMOS pull-up switches and pull-down transconductance devices configured to carry multiple amperes of current. The physical die area consumption is also fundamentally offset by the elimination of the 50 mA sources and the 30 mA sinks.

Figure 22:
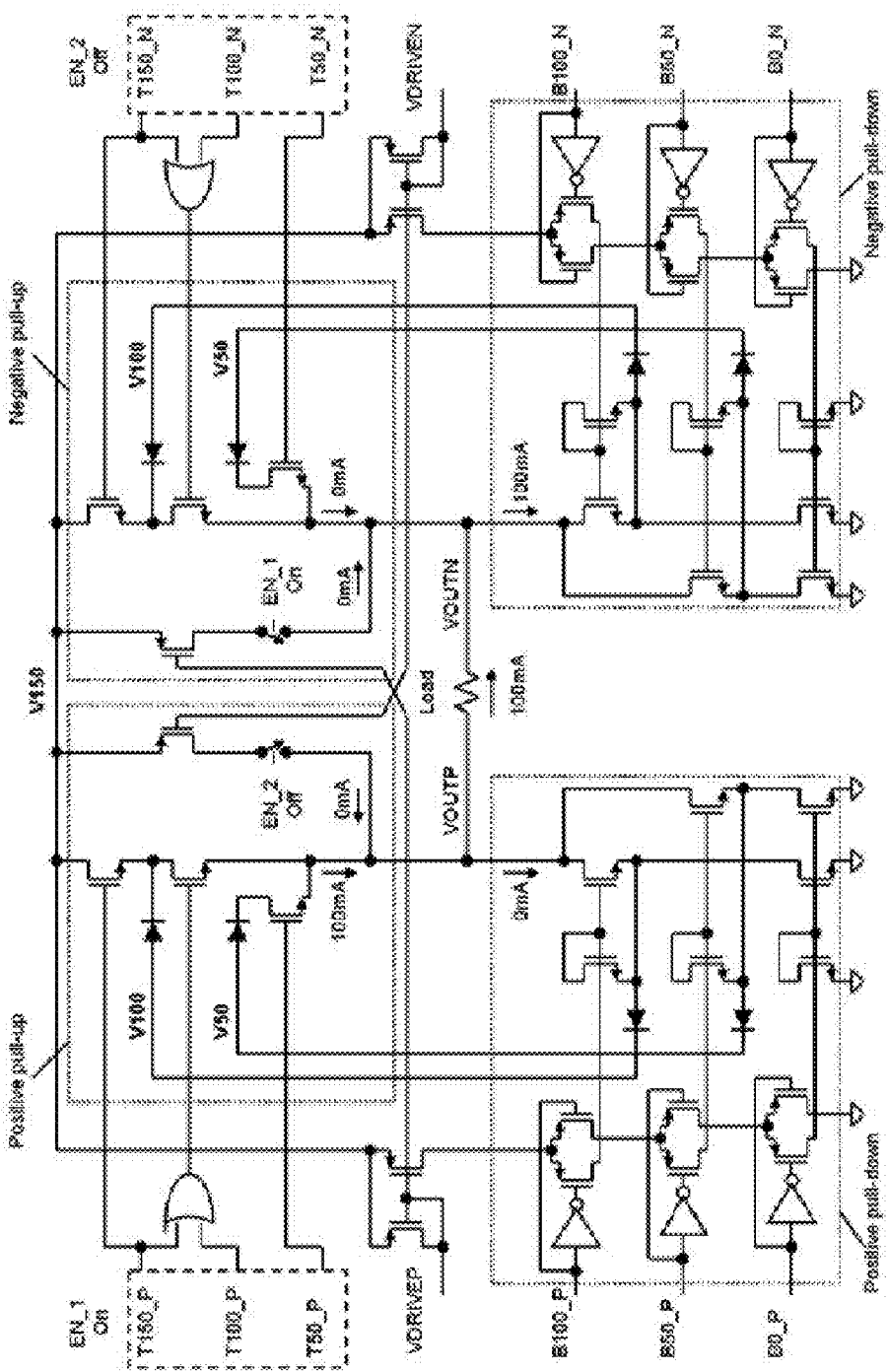
Figure 23:
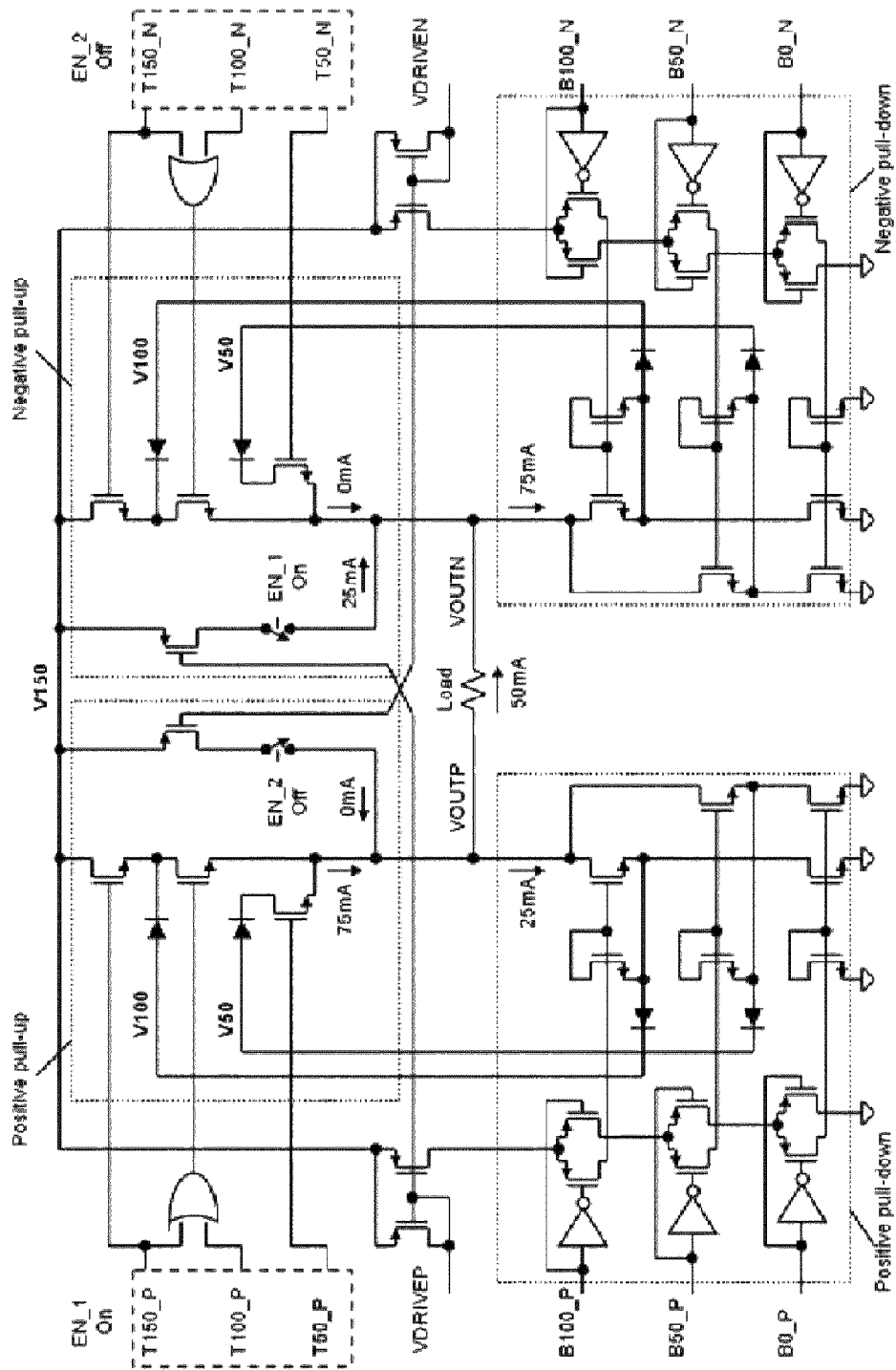
Figure 24:
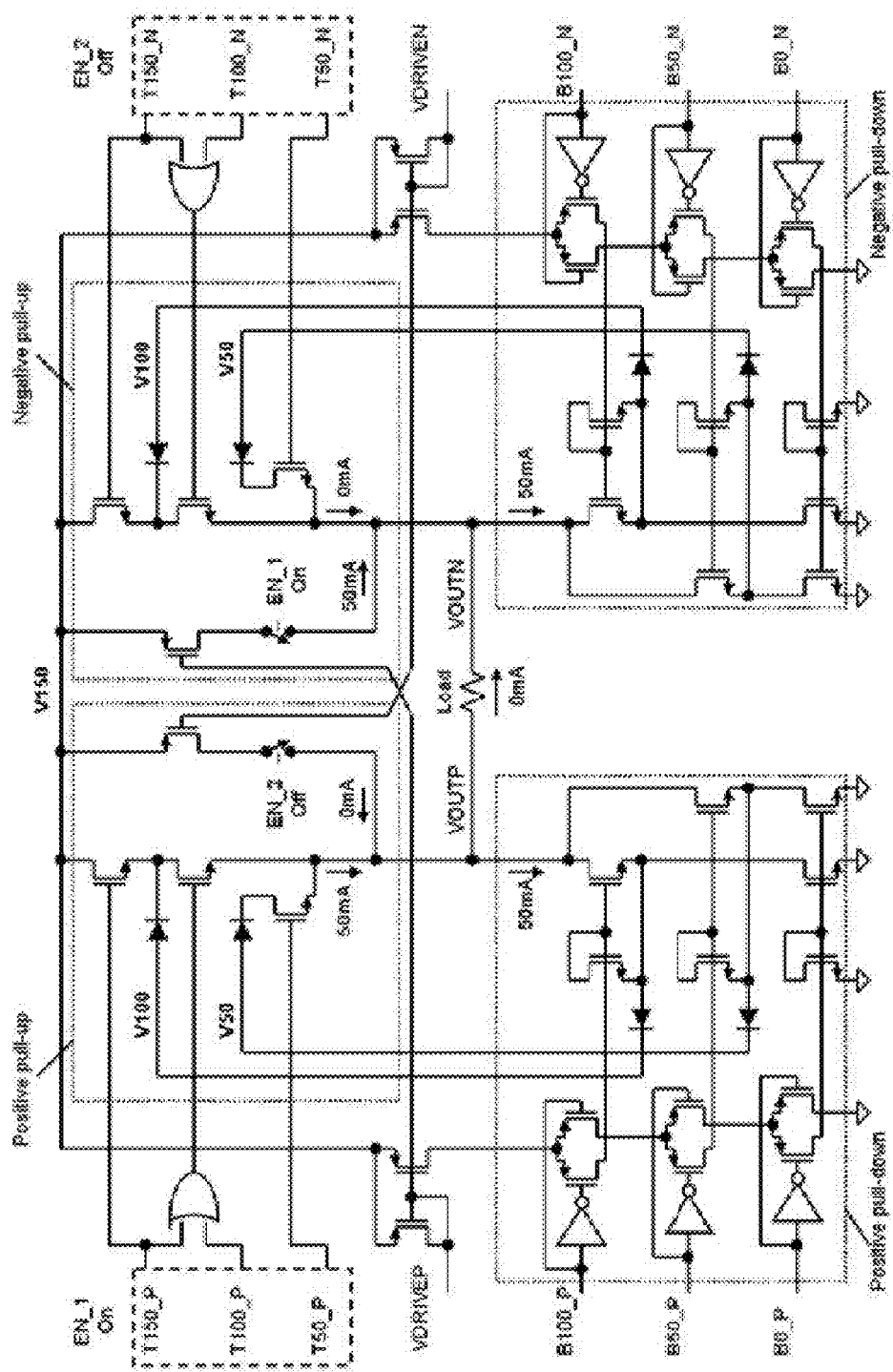
Figure 25:
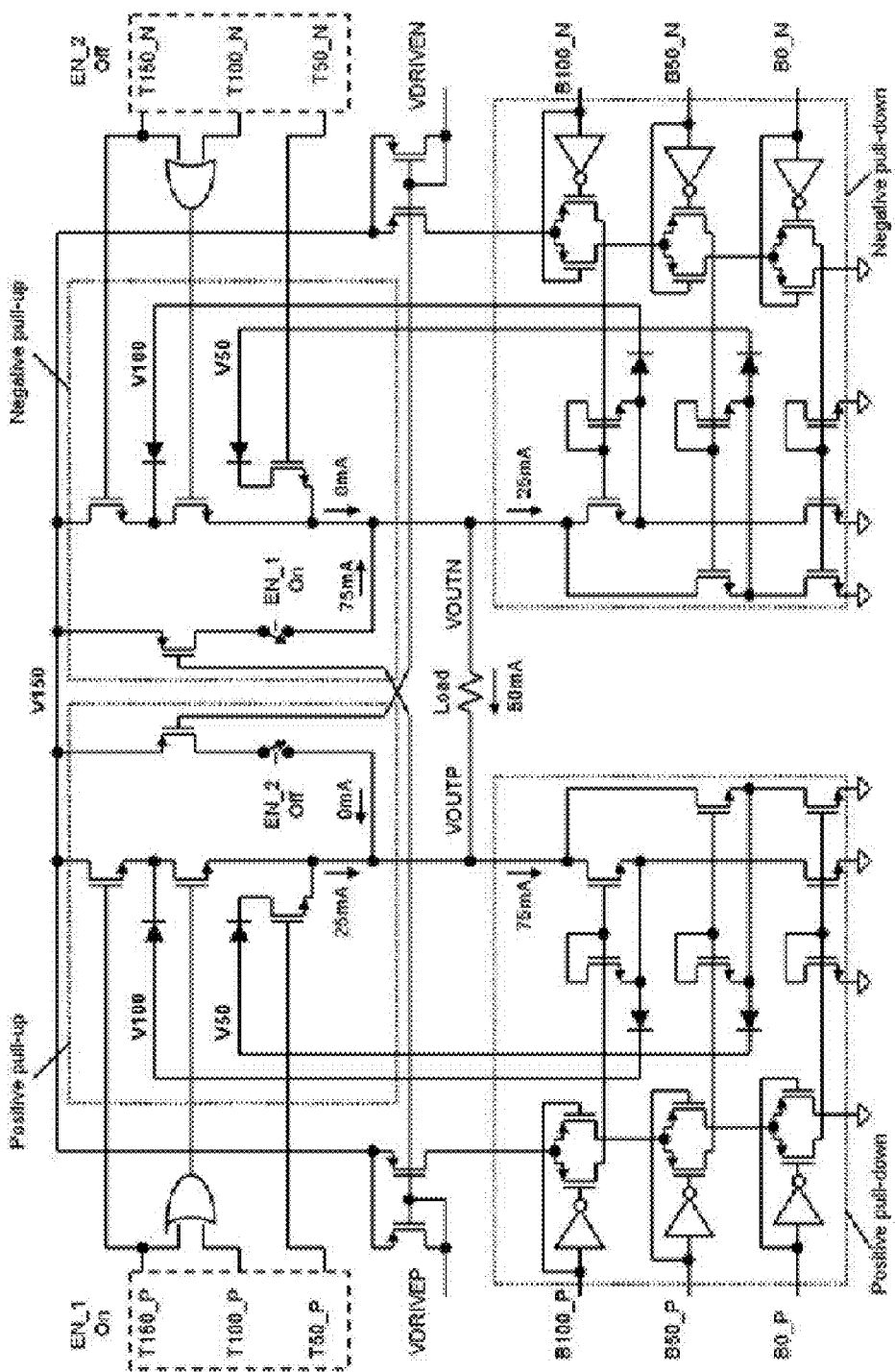
Figure 26:
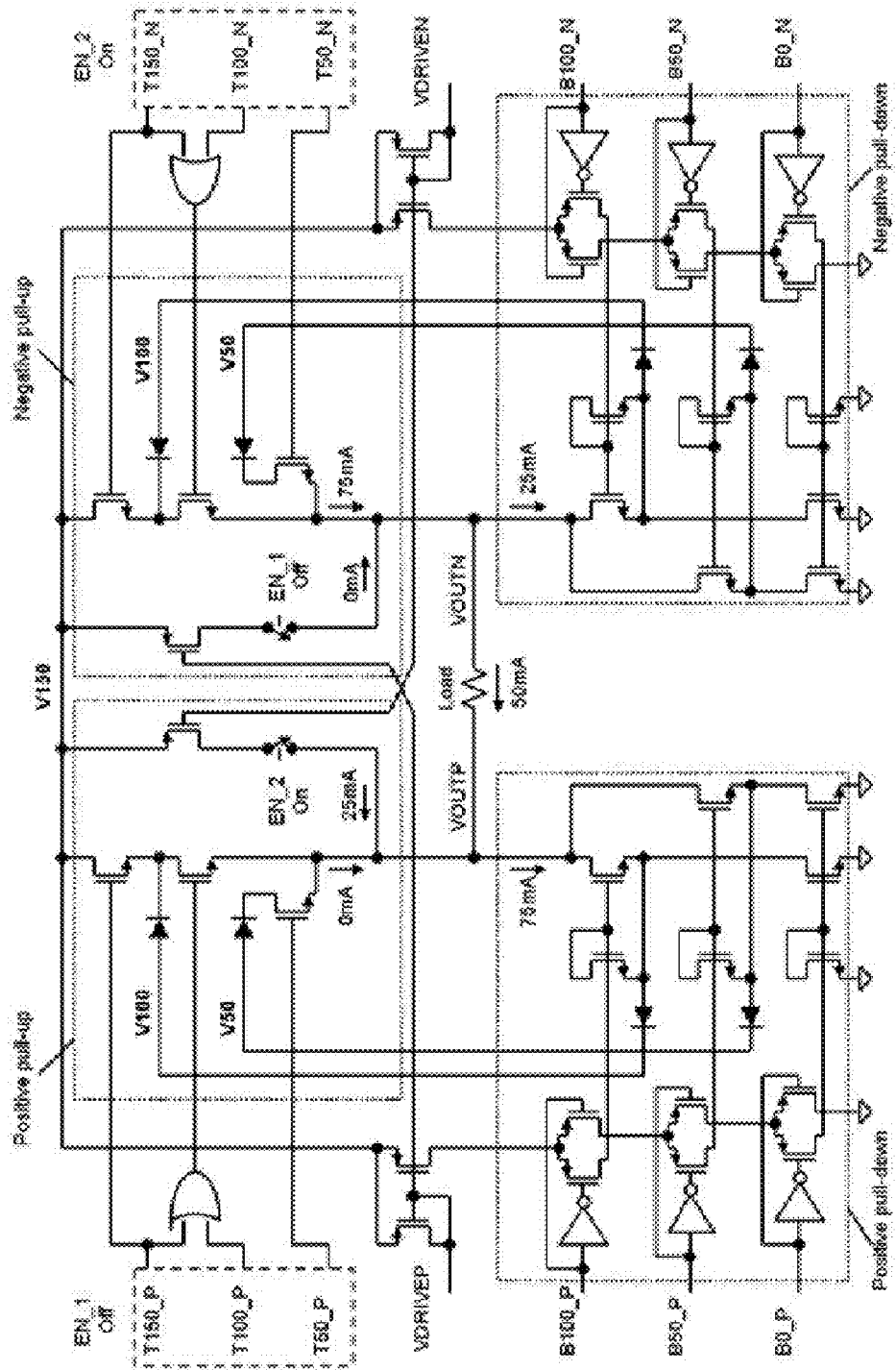

FIGS. 22-26 illustrate generally an example of an amplifier reversal operation using the amplifier configuration of FIG. 21. FIG. 22 illustrates generally 100 mA of current flowing from a positive side through a load and into a negative side with EN1 enabled and EN2 disabled. As the demand for current in the load ramps down to 50 mA, the currents change to that shown in FIG. 23. In FIG. 23, the error amplifier has begun to introduce current in the negative pull-up and positive pull-down sections. In FIG. 24, the error amplifier is in a balanced state, which by specific intent occurs with 50 mA in both the pull-down sections as well as in the negative pull-up section. Here, the 50 mA balance point was chosen to be twice the amplifier reversal threshold of 25 mA, thereby providing significant margin. In other examples, other balance points, thresholds, components, or specific operations can be chosen. At this point, the load current has ramped to zero and is ready to reverse, even though EN1 is still active and the 25 mA amplifier reversal threshold as sensed at the negative pull-down section has yet to be crossed. In FIG. 25, the load current has reversed to 50 mA and the current in the negative pull-down section is verging on crossing the 25 mA amplifier reversal threshold. FIG. 26 illustrates the amplifier configuration just after the amplifier reversal event has taken place, with the 50 mA load current unchanged but with the amplifier now reconfigured with EN1 disabled and EN2 enabled. Here, the instant the amplifier reversal occurs, the currents in the positive pull-down and negative pull-down sections do not experience any change, meaning that the outputs of the error amplifier have also experienced no change. As such, there is no instantaneous voltage adjustment required at the input of the error amplifier at the time of the amplifier reversal, and thus the reversal event produces no inherent input-referred voltage disturbance.

Figure 27:
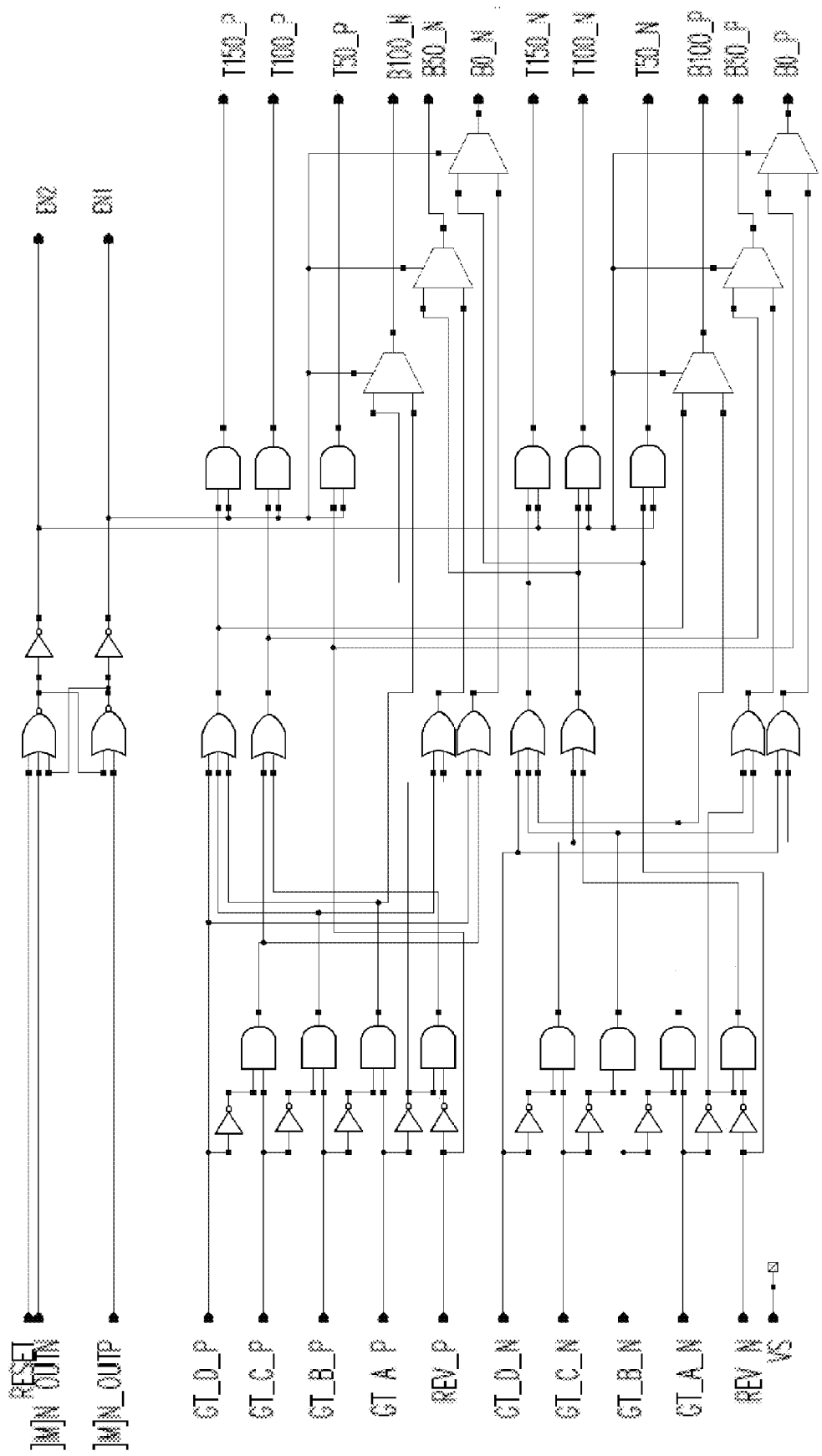

FIG. 27 illustrates generally an example of modified control logic for the example of FIG. 21.

Figure 28:
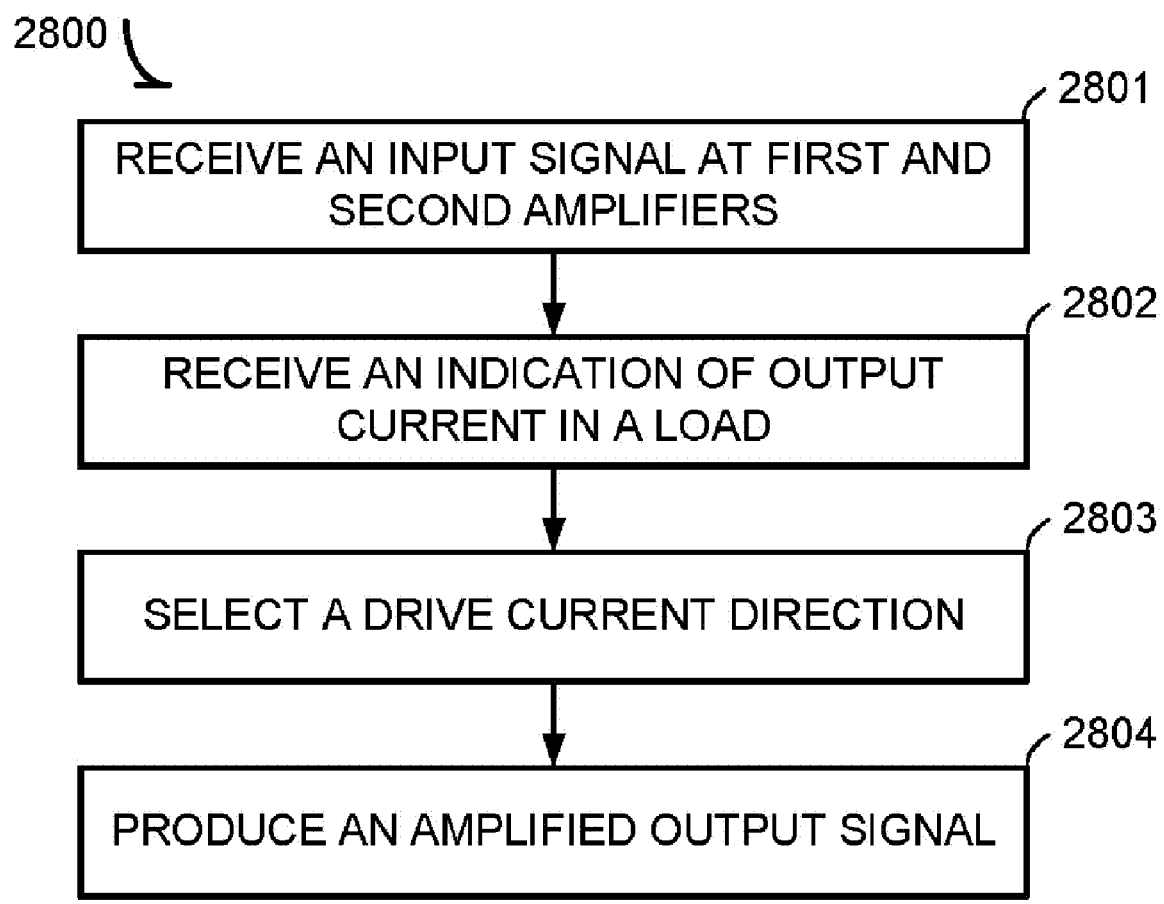
FIGS. 28-29 illustrate generally examples of a method including receiving an input signal at first and second amplifiers and producing an amplified output signal.

FIG. 28 illustrates generally an example of a method 2800 including receiving an input signal at first and second amplifiers and producing an amplified output signal.

At 2801, an input signal is received at first and second amplifiers (e.g., the first amplifier 605, the second amplifier 606, etc.). In an example, the first and second amplifiers can be in a bridge-tied load (BTL) amplifier configuration.

At 2802, an indication of an output current in a load is received. In an example, the output current across the load can be sensed (e.g., using a current sensor). In an example, the indication of the output current can be received using digital logic circuitry (e.g., the digital logic circuitry 615), or using one or more other components, such as one or more processors or controllers.

At 2803, a drive current direction is selected. In an example, the drive current includes a drive current between the first and second amplifiers in a BTL amplifier configuration. In certain examples, the drive current direction can be selected by the digital logic circuitry, or the one or more other components, using the received output current information. In an example, the drive current direction can be selected using the received output current information, and not using any output voltage information.

At 2804, an amplified output signal is produced. In an example, the amplified output signal can be produced using the selected drive current direction and the first and second amplifiers. In certain examples, the amplified output signal can be configured to drive an at least partially reactive load (e.g., the output current at least partially out of phase with an output voltage). In other examples, the amplifier output can be configured to drive a purely resistive load.

The first and second amplifiers can be configured to alternate between a pull-up mode and a pull-down mode, each amplifying half of a full wave output signal. In an example, current for each of the first and second amplifiers can be drawn from a power rail using pull-up devices and sunk to a power rail using pull-down devices.

In an example, the current for the first and second amplifiers can be drawn using a pull-up switch configured to draw current from and hold its output to a first power rail and sunk using a transconductive pull-down device configured to sink a variable current into a second power rail in response to a received input signal.

In another example, the current for the first and second amplifiers can be drawn using a transconductive pull-up device configured to draw a variable current from the first power rail in response to the received input signal and sunk using a pull-down switch configured to sink current into and hold its output to the second power rail.

Figure 29:
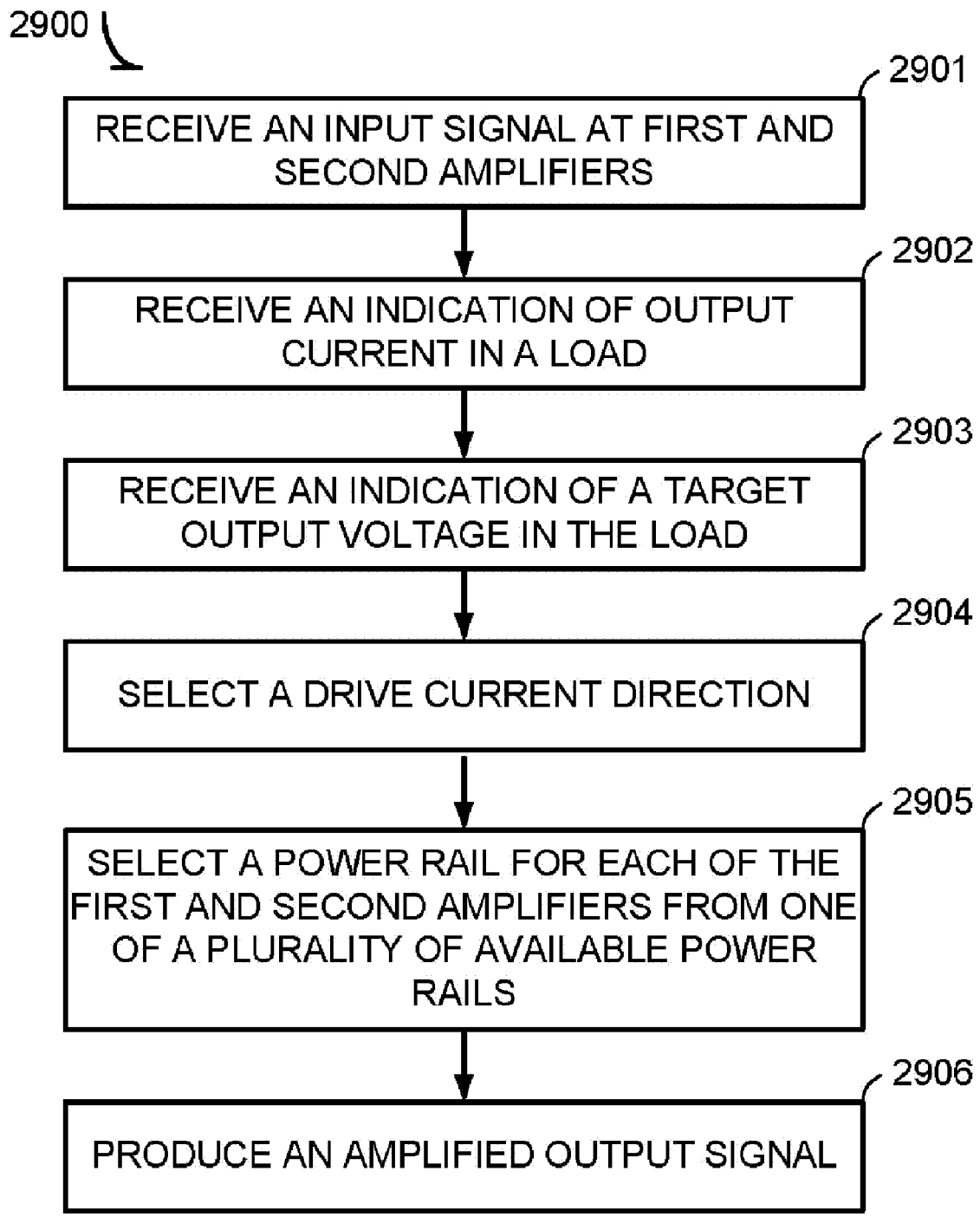

FIG. 29 illustrates generally an example of a method 2900 including receiving an input signal at first and second amplifiers and producing an amplified output signal.

At 2901, an input signal is received at first and second amplifiers (e.g., the first amplifier 605, the second amplifier 606, etc.). In an example, the first and second amplifiers can be in a bridge-tied load (BTL) amplifier configuration.

At 2902, an indication of an output current in a load is received. In an example, the output current across the load can be sensed (e.g., using a current sensor). In an example, the indication of the output current can be received using digital logic circuitry (e.g., the digital logic circuitry 615), or using one or more other components, such as one or more processors or controllers.

At 2903, an indication of a target output voltage in the load is received. In an example, the target output voltage can include an actual voltage sensed across the load, or the target output voltage can include a simulated output voltage. In an example, the indication of the target output voltage can be received using the digital logical circuitry, or using one or more other components, such as one or more processors or controllers.

At 2904, a drive current direction is selected. In an example, the drive current includes a drive current between the first and second amplifiers in a BTL amplifier configuration. In certain examples, the drive current direction can be selected by the digital logic circuitry, or the one or more other components, using the received output current information. In an example, the drive current direction can be selected using the received output current information, and not using any output voltage information.

At 2905, a power rail for each of the first and second amplifiers can be selected from one of a plurality of available power rails. In an example, the power rails can be selected using the digital logic circuitry, or the one or more other components, using the received target output voltage information. In an example, the power rails can be selected to minimize a voltage drop between the selected power rails and the target output voltage information (e.g., to minimize power loss, etc.).

At 2906, an amplified output signal is produced. In an example, the amplified output signal can be produced using the selected drive current direction and the first and second amplifiers. In certain examples, the amplified output signal can be configured to drive an at least partially reactive load (e.g., the output current at least partially out of phase with an output voltage). In other examples, the amplifier output can be configured to drive a purely resistive load.

Other Examples

One or more other examples can include selective connection (e.g., multiplexing or commutation) of the source terminal of each gated PMOS pull-up device, based on the instantaneous voltage of the respective output terminal, to any power supply rail. In certain examples, this can result in a small (e.g., smallest possible) |Vds| across the device while still keeping the device in the saturation region, essentially applying conventional class-G treatment to the gated PMOS pull-up devices, minimizing their V*I product and cutting power dissipation.

In certain examples, the magnitude of both load voltage and load current can be considered in the process of deciding the proper commutation of output devices among the assortment of available power supply rails in a class-G integrated bridge-tied load (BTL) amplifier circuit. In certain examples, the BTL amplifier configuration described herein can properly manage the unidirectional current flow limitation of switched-pull-up/transconductance-pull-down architectures inherent with the use of area-efficient n-type devices for high-current handling in the amplifier output stages such that reactive loads and their incumbent wide range of phase relationships between voltage and current can be driven without discontinuities in the output waveform.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown and described. However, the present inventor also contemplates examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A bridge-tied load (BTL) amplifier system for driving an at least partially reactive load, comprising:
   first and second amplifiers configured to receive an input signal and to produce an amplified output signal, each of the first and second amplifiers including an output stage, each of the output stages including:
      a pull-up device configured to draw current from a first power rail; and
      a pull-down device configured to sink current into a second power rail;
      the first and second amplifiers, configured to alternate between a pull-up mode and a pull-down mode, each amplifying substantially half of a full wave output signal; and
   digital logic circuitry configured to receive an indication of output current in the load and to select a current drive direction of the first and second amplifiers using the received output current information.

2. The amplifier system of claim 1, wherein the first and second amplifiers are configured to drive an at least partially reactive load.

3. The amplifier system of claim 1, wherein the digital logic circuitry is configured to receive the indication of output current in the load, the output current at least partially out of phase with an output voltage in the load.

4. The amplifier system of claim 1, wherein the pull-up and pull-down devices include n-type devices.

5. The amplifier system of claim 1, wherein the pull-up device includes a pull-up switch configured to draw current from and hold its output to the first power rail; and
   wherein the pull-down device includes a transconductive pull-down device configured to sink a variable current into the second power rail in response to the received input signal.

6. The amplifier system of claim 1, wherein the pull-up device includes a transconductive pull-up device configured to draw a variable current from the first power rail in response to the received input signal; and
   wherein the pull-down device includes a pull-down switch configured to sink current to and hold its output to the second power rail.

7. The amplifier system of claim 1, wherein the first power rail includes one of a plurality of available power rails;
   wherein the second power rail includes one of the plurality of available power rails; and
   wherein the digital logic circuitry is configured to receive an indication of a target output voltage in a load and to select the first and second power rails for each of the first and second amplifiers from the plurality of available power rails using the received output voltage information.

8. The amplifier system of claim 7, wherein the digital logic circuitry is configured to select the first and second power rails for each of the first and second amplifiers using the received target output voltage information to minimize a voltage drop between the selected first and second power rails and the received target output voltage information.

9. A bridge-tied load (BTL) amplifier system, responsive to both load voltage and load current, for driving an at least partially reactive load, comprising:
   first and second amplifiers configured to receive an input signal and to produce an amplified output signal, each of the first and second amplifiers including an output stage, each of the output stages including:
      a pull-up switch configured to draw current from and hold its output to one of a plurality of available power rails; and
      a transconductive pull-down device configured to sink a variable current into one of the plurality of available power rails in response to the input signal;
      the first and second amplifiers, configured to alternate between a switched pull-up mode and a variable pull-down mode, each amplifying substantially half of a full wave output signal; and
   digital logic circuitry configured to receive an indication of an output current and a target output voltage in the load, to select a current drive direction of the first and second amplifiers using the received output current information, and to select the power rails for each of the first and second amplifiers from the plurality of available power rails using the received output voltage information.

10. The amplifier system of claim 9, wherein the first and second amplifiers are configured to drive an at least partially reactive load.

11. The amplifier system of claim 9, wherein the digital logic circuitry is configured to receive the indication of output current and the target output voltage in the load, the output current at least partially out of phase with the target output voltage.

12. The amplifier system of claim 9, wherein the pull-up and pull-down devices include n-type devices.

13. The amplifier system of claim 9, wherein the digital logic circuitry is configured to select the power rails for each of the first and second amplifiers using the received output voltage information to minimize a voltage drop between the selected power rails and the received target output voltage information.

14. A method of driving an at least partially reactive load, comprising:
   receiving an input signal at first and second amplifiers;
   receiving an indication of an output current in the load;
   selecting a drive current direction between the first and second amplifiers using the received output current information; and
   producing an amplified output signal using the selected drive current direction and the first and second amplifiers, the first and second amplifiers, configured to alternate between a pull-up mode and a pull-down mode, each amplifying half of a full wave output signal.

15. The method of claim 14, wherein the producing the amplified output signal includes producing an amplified output signal to drive an at least partially reactive load.

16. The method of claim 14, wherein the receiving the indication of the output current in the load includes receiving an indication of an output current at least partially out of phase with an output voltage in the load.

17. The method of claim 14, including:
   drawing current for each of the first and second amplifiers from a first power rail using pull-up devices and sinking current for each of the first and second amplifiers to a second power rail using pull-down devices.

18. The method of claim 17, wherein the drawing and sinking the current for the first and second amplifiers includes drawing current using n-type pull-up devices and sinking current using n-type pull-down devices.

19. The method of claim 17, wherein the drawing the current for the first and second amplifiers includes using a pull-up switch configured to draw current from and hold its output to the first power rail; and
   wherein the sinking the current for the first and second amplifiers includes using a transconductive pull-down device configured to sink a variable current into the second power rail in response to the received input signal.

20. The method of claim 17, wherein the drawing the current for the first and second amplifiers includes using a transconductive pull-up device configured to draw a variable current from the first power rail in response to the received input signal; and
   wherein the sinking the current for the first and second amplifiers includes using a pull-down switch configured to sink current into and hold its output to the second power rail.

21. The method of claim 14, including:
   drawing current for each of the first and second amplifiers from one of a plurality of available power rails using pull-up devices and sinking current for each of the first and second amplifiers from one of the plurality of available power rails using pull-down devices.

22. The method of claim 21, including:
   receiving an indication of a target output voltage in a load; and
   selecting the power rails for each of the first and second amplifiers from the one of the plurality of available power rails using the received target output voltage information.

23. The method of claim 22, wherein the selecting the power rails for each of the first and second amplifiers includes to minimize a voltage drop between the selected first and second power rails and the received target output voltage information.

* * * * *